United States Patent
Ausserlechner et al.

(10) Patent No.: US 9,222,992 B2
(45) Date of Patent: Dec. 29, 2015

(54) MAGNETIC FIELD CURRENT SENSORS

(75) Inventors: Udo Ausserlechner, Villach (AT); Mario Motz, Wernberg (AT)

(73) Assignee: Infineon Technologies AG, Neubiberg (DE)

( * ) Notice: Subject to any disclaimer, the term of this patent is extended or adjusted under 35 U.S.C. 154(b) by 931 days.

(21) Appl. No.: 12/630,596

(22) Filed: Dec. 3, 2009

(65) Prior Publication Data

US 2010/0156394 A1 Jun. 24, 2010

Related U.S. Application Data

(60) Provisional application No. 61/138,557, filed on Dec. 18, 2008.

(51) Int. Cl.
*G01R 15/20* (2006.01)
*G01R 33/07* (2006.01)

(52) U.S. Cl.
CPC ............ *G01R 33/072* (2013.01); *G01R 15/207* (2013.01); *G01R 33/075* (2013.01); *G01R 15/202* (2013.01)

(58) Field of Classification Search
CPC .. G01R 15/202; G01R 15/205; G01R 15/207; G01R 19/0092; H01F 3/10
USPC ...................... 324/117 H, 244, 248, 144, 260
See application file for complete search history.

(56) References Cited

U.S. PATENT DOCUMENTS

| | | |
|---|---|---|
| 3,323,057 A | 5/1967 | Haley |
| 4,559,495 A | 12/1985 | Liehard |
| 4,894,610 A * | 1/1990 | Friedl ........................... 324/127 |
| 5,017,804 A | 5/1991 | Harnden |
| 5,041,780 A | 8/1991 | Rippel |
| 5,173,758 A | 12/1992 | Heremans |
| 5,642,041 A | 6/1997 | Berkcan |
| 5,786,976 A | 7/1998 | Field |
| 5,963,028 A | 10/1999 | Engle |
| 6,310,470 B1 | 10/2001 | Hebing |

(Continued)

FOREIGN PATENT DOCUMENTS

| | | |
|---|---|---|
| DE | 19821492 | 11/1999 |
| DE | 10233129 A1 | 2/2003 |

(Continued)

OTHER PUBLICATIONS

Steiner et al., "Fully Packaged CMOS Current Monitor Using Lead-On-Chip Technology," *Physical Electronics Laboratory*, pp. 603-608, © 1998.

(Continued)

*Primary Examiner* — Tung X Nguyen
*Assistant Examiner* — Giovanni Astacio-Oquendo
(74) *Attorney, Agent, or Firm* — Schiff Hardin LLP

(57) ABSTRACT

Embodiments related to magnetic current sensors, systems and methods. In an embodiment, a magnetic current sensor integrated in an integrated circuit (IC) and housed in an IC package comprises an IC die formed to present at least three magnetic sense elements on a first surface, a conductor, and at least one slot formed in the conductor, wherein a first end of the at least one slot and at least one of the magnetic sense elements are relatively positioned such that the at least one of the magnetic sense elements is configured to sense an increased magnetic field induced in the conductor proximate the first end of the at least one slot.

18 Claims, 32 Drawing Sheets

(56) References Cited

U.S. PATENT DOCUMENTS

| | | | |
|---|---|---|---|
| 6,341,416 B1 | 1/2002 | Biskeborn | |
| 6,356,068 B1 * | 3/2002 | Steiner et al. | 324/117 H |
| 6,424,018 B1 | 7/2002 | Ohtsuka | |
| 6,452,413 B1 | 9/2002 | Burghartz | |
| 6,462,531 B1 * | 10/2002 | Ohtsuka | 324/117 H |
| 6,512,359 B1 * | 1/2003 | Tamai et al. | 324/117 R |
| 6,636,029 B1 | 10/2003 | Kunze | |
| 6,683,448 B1 | 1/2004 | Ohtsuka | |
| 6,697,660 B1 * | 2/2004 | Robinson | 600/409 |
| 6,727,683 B2 | 4/2004 | Goto | |
| 6,781,313 B2 | 8/2004 | Aiken | |
| 6,781,358 B2 | 8/2004 | Goto | |
| 6,841,989 B2 | 1/2005 | Goto | |
| 6,940,265 B2 | 9/2005 | Hauenstein | |
| 6,949,927 B2 | 9/2005 | Goetz | |
| 6,995,315 B2 | 2/2006 | Sharma | |
| 7,073,287 B2 * | 7/2006 | Lau | 43/112 |
| 7,075,287 B1 * | 7/2006 | Mangtani et al. | 324/117 H |
| 7,106,233 B2 * | 9/2006 | Schroeder et al. | 341/141 |
| 7,129,691 B2 | 10/2006 | Shibahara | |
| 7,166,807 B2 | 1/2007 | Gagnon | |
| 7,259,545 B2 | 8/2007 | Stauth | |
| 7,358,724 B2 | 4/2008 | Taylor | |
| 7,375,507 B2 | 5/2008 | Racz | |
| 7,474,093 B2 | 1/2009 | Ausserlechner | |
| 7,476,816 B2 | 1/2009 | Doogue | |
| 7,476,953 B2 | 1/2009 | Taylor | |
| 7,492,178 B2 | 2/2009 | Bidenbach | |
| 7,528,593 B2 | 5/2009 | Tanizawa | |
| 7,545,136 B2 | 6/2009 | Racz | |
| 7,564,239 B2 | 7/2009 | Mapps | |
| 7,605,580 B2 | 10/2009 | Strzalkowski | |
| 7,709,754 B2 | 5/2010 | Doogue | |
| 7,746,056 B2 | 6/2010 | Stauth | |
| 7,768,083 B2 * | 8/2010 | Doogue et al. | 257/422 |
| 7,796,028 B1 * | 9/2010 | Kotter et al. | 340/539.22 |
| 7,816,905 B2 | 10/2010 | Doogue | |
| 7,923,987 B2 | 4/2011 | Ausserlechner | |
| 8,159,254 B2 | 4/2012 | Kaltalioglu | |
| 8,217,643 B2 * | 7/2012 | Kuroki et al. | 324/117 H |
| 8,283,742 B2 | 10/2012 | Motz | |
| 8,629,539 B2 * | 1/2014 | Milano et al. | G01R 33/0076 238/123 |
| 8,760,149 B2 * | 6/2014 | Ausserlechner | 324/117 H |
| 2001/0052780 A1 | 12/2001 | Hayat-Dawoodi | |
| 2003/0155905 A1 | 8/2003 | Hauenstein | |
| 2004/0189293 A1 * | 9/2004 | Czipott et al. | 324/244 |
| 2005/0270013 A1 | 12/2005 | Berkcan | |
| 2005/0270014 A1 | 12/2005 | Zribi | |
| 2006/0076947 A1 | 4/2006 | Berkcan | |
| 2006/0082983 A1 | 4/2006 | Parkhill | |
| 2006/0197523 A1 * | 9/2006 | Palecki et al. | 324/244 |
| 2006/0244446 A1 * | 11/2006 | Dewdney et al. | 324/307 |
| 2006/0255797 A1 | 11/2006 | Taylor | |
| 2006/0284613 A1 | 12/2006 | Hastings | |
| 2007/0063690 A1 | 3/2007 | DeWilde | |
| 2007/0120560 A1 * | 5/2007 | Rempt | 324/238 |
| 2007/0170533 A1 | 7/2007 | Doogue | |
| 2007/0290682 A1 | 12/2007 | Oohira | |
| 2008/0035923 A1 | 2/2008 | Tschmelitsch | |
| 2008/0297138 A1 | 12/2008 | Taylor | |
| 2008/0312854 A1 | 12/2008 | Chemin | |
| 2009/0026560 A1 | 1/2009 | Wombacher | |
| 2009/0045498 A1 * | 2/2009 | Braden et al. | H01L 23/24 257/687 |
| 2009/0050990 A1 | 2/2009 | Aono | |
| 2009/0058412 A1 | 3/2009 | Taylor | |
| 2009/0128130 A1 | 5/2009 | Stauth | |
| 2009/0152595 A1 | 6/2009 | Kaga | |
| 2009/0184704 A1 | 7/2009 | Guo | |
| 2009/0294882 A1 | 12/2009 | Sterling | |
| 2009/0295368 A1 | 12/2009 | Doogue | |
| 2009/0322325 A1 | 12/2009 | Ausserlechner | |
| 2010/0045285 A1 | 2/2010 | Ohmori | |
| 2010/0045286 A1 | 2/2010 | Hotz | |
| 2010/0117638 A1 | 5/2010 | Yamashita | |
| 2010/0156394 A1 | 6/2010 | Ausserlechner | |
| 2010/0231198 A1 | 9/2010 | Bose | |
| 2010/0237853 A1 | 9/2010 | Bose | |
| 2011/0062956 A1 | 3/2011 | Edelstein | |
| 2011/0133732 A1 | 6/2011 | Sauber | |
| 2011/0172938 A1 | 7/2011 | Gu | |
| 2011/0204887 A1 | 8/2011 | Ausserlechner | |
| 2011/0234215 A1 | 9/2011 | Ausserlechner | |
| 2011/0248711 A1 | 10/2011 | Ausserlechner | |
| 2011/0298454 A1 | 12/2011 | Ausserlechner | |
| 2011/0304327 A1 | 12/2011 | Ausserlechner | |
| 2012/0049884 A1 | 3/2012 | Kaltalioglu | |
| 2012/0112365 A1 | 5/2012 | Ausserlechner | |
| 2012/0146164 A1 | 6/2012 | Ausserlechner | |
| 2012/0146165 A1 | 6/2012 | Ausserlechner | |
| 2012/0262152 A1 | 10/2012 | Ausserlechner | |

FOREIGN PATENT DOCUMENTS

| | | |
|---|---|---|
| DE | 10231194 | 2/2004 |
| DE | 19946935 | 2/2004 |
| DE | 60 2005 003 777 T2 | 12/2008 |
| WO | WO 01/23899 A1 | 4/2001 |
| WO | WO 2005/033718 A1 | 4/2005 |
| WO | WO 2008/008140 | 1/2008 |
| WO | WO 2009/088767 | 9/2009 |

OTHER PUBLICATIONS

Lutz et al., "Double-Sided Low-Temperature Joining Technique for Power Cycling Capability at High Temperature," EPE 2005-Dresden, ISBN: 90-75815-08-5.

Schwarzbauer et al., "Novel Large Area Joining Technique for Improved Power Device Performance," *IEEE Transactions on Industry Applications*, vol. 27, No. 1, pp. 93-95, 1991.

Allegro, Allego Hall Effect-Based Current Sensor ICs: Revolutionary, high accuracy, high bandwidth current sensing!, www.allegomicro.com/en/Products/Design/curren_sensors/index.asp, 5 pages, © 2010.

Allegro, *Hall-Effect Sensor IC's: Current Sensor ICs*, 1 page, © 2010.

Allegro, High Bandwidth, Fast Fault Response Current Sensor IC in Thermally Enhanced Package, ACS709-DS, www.microallegro.com, 16 pages, © 2008-2009.

Allegro, *Fully Integrated, Hall Effect-Based Linear Current Sensor IC with 2.1 kVRMS Isolation and a Low-Resistance Current Conductor*, ACS712-DS, Rev. 13, 14 pages, © 2006-2010.

Sandireddy, Sandhya, *IEEE Xplore*, © 2005, *Advanced Wafer Thinning Technologies to Enable Multichip Packages*, pp. 24-27.

Hopkins, Allegro MicroSystems, Inc., High-Performance Power ICs and Hall-Effect Sensors, "Hall Effect Technology for Server, Backplane and Power Supply Applications", IBM 2008 Power and Cooling Symposium, Sep. 30, 2008, 34 pages.

Application and File History for U.S. Appl. No. 12/963,817, filed Dec. 9, 2010, Inventors: Ausserlechner et al.

Application and File History for U.S. Appl. No. 12/711,471, filed Feb. 24, 2010, Inventors: Ausserlechner et al.

Application and File History for U.S. Appl. No. 12/813,218, filed Jun. 10, 2010, Inventors: Ausserlechner et al.

Application and File History for U.S. Appl. No. 12/963,787, filed Dec. 9, 2010, Inventors: Ausserlechner et al.

Application and File History for U.S. Appl. No. 12/756,652, filed Apr. 8, 2010, Inventors: Ausserlechner.

Application and File History for U.S. Appl. No. 12/872,665, filed Aug. 31, 2010, Inventors: Ausserlechner et al.

Application and File History for U.S. Appl. No. 13/012,096, filed Jan. 24, 2011, Inventors: Ausserlechner et al.

Application and File History for U.S. Appl. No. 13/086,566, filed Apr. 14, 2011, Inventors: Ausserlechner.

Application and File History for U.S. Appl. No. 13/626,456, Inventor: Motz, filed Sep. 25, 2012.

* cited by examiner

SLICE: TOTAL CURRENT DENSITY NORM [A/m$^2$]
STREAMLINE: TOTAL CURRENT DENSITY [A/m$^2$]

MAX: $3.866 \times 10^{10}$
MIN: 3031.7

SLICE: ELECTRIC POTENTIAL [V]
STREAMLINE: TOTAL CURRENT DENSITY [A/m$^2$]

MAX: 1.0
MIN: 0

CROSS-SECTION THROUGH CURRENT SENSOR IC

STREAMLINE: TOTAL CURRENT DENSITY [A/m$^2$]

SLICE: TOTAL CURRENT DENSITY, NORM [A/m$^2$]

MAX: 2.00

MIN: 1.294

TOTAL SIGNAL= (S1-S2)-(S2-S3) = S1-2*S2-S3

TOTAL SIGNAL= (S1-S2)-(S2-S3) = S1-2*S2-S3

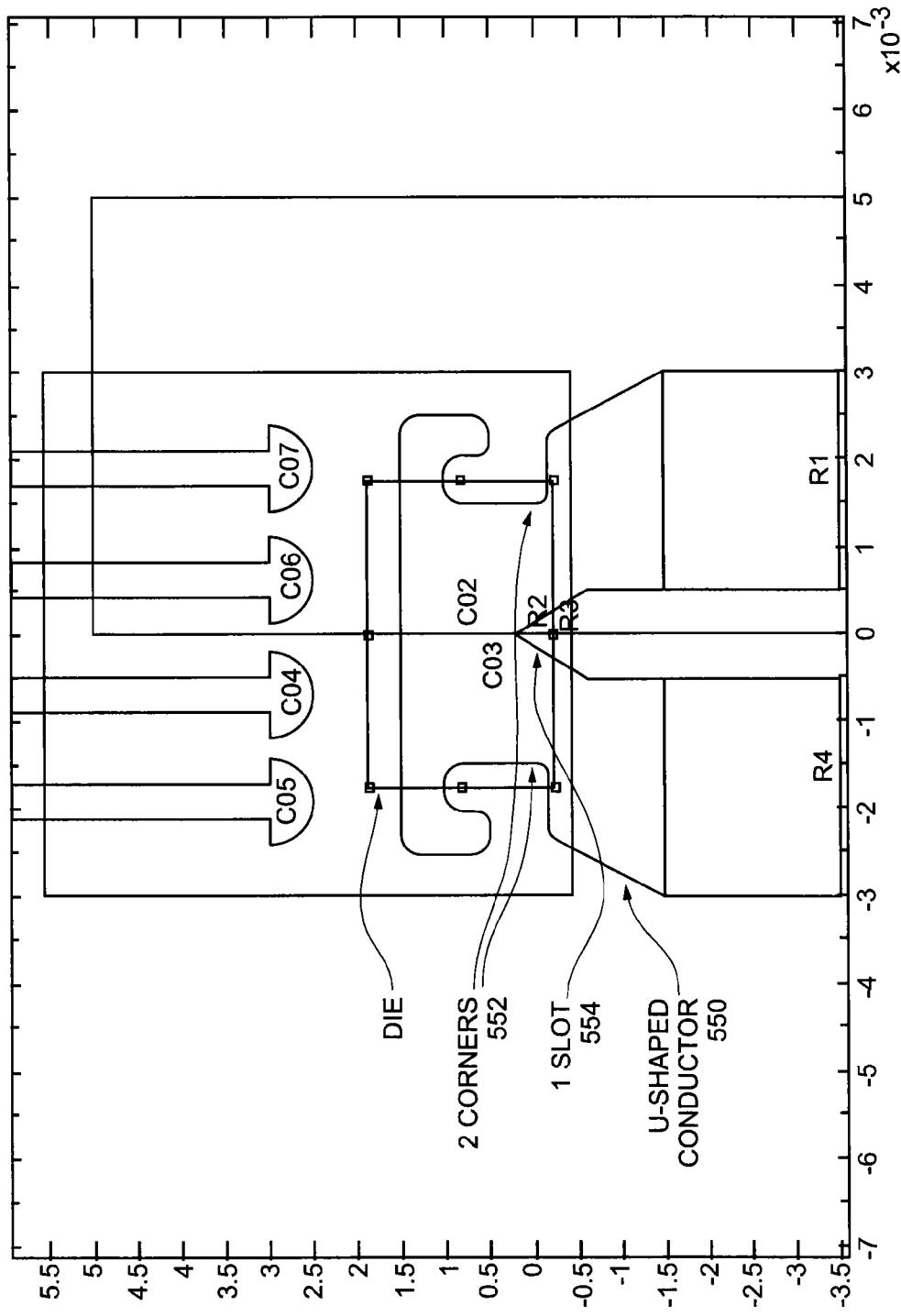

TOTAL SIGNAL= (S1-S2)-(S2-S3) = S1-2*S2+S3

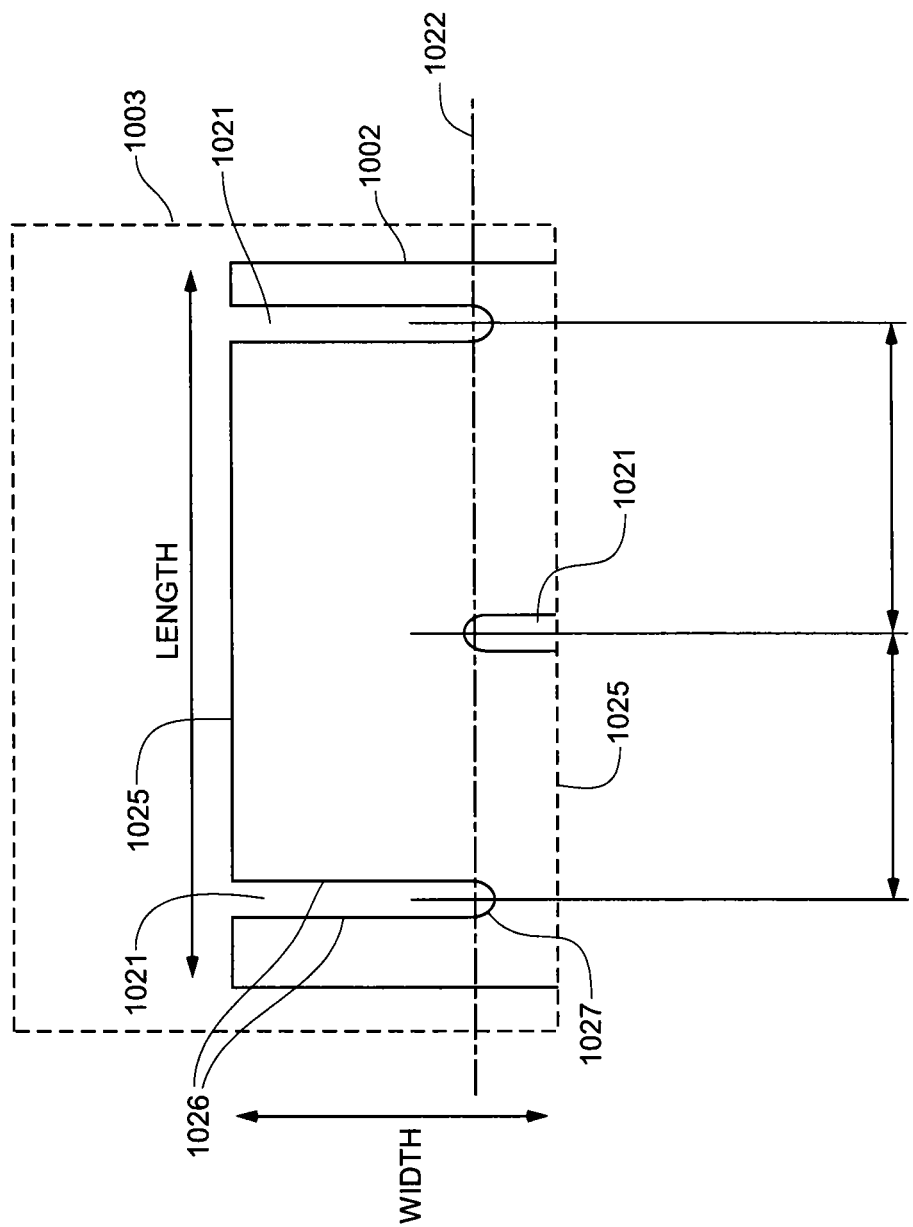

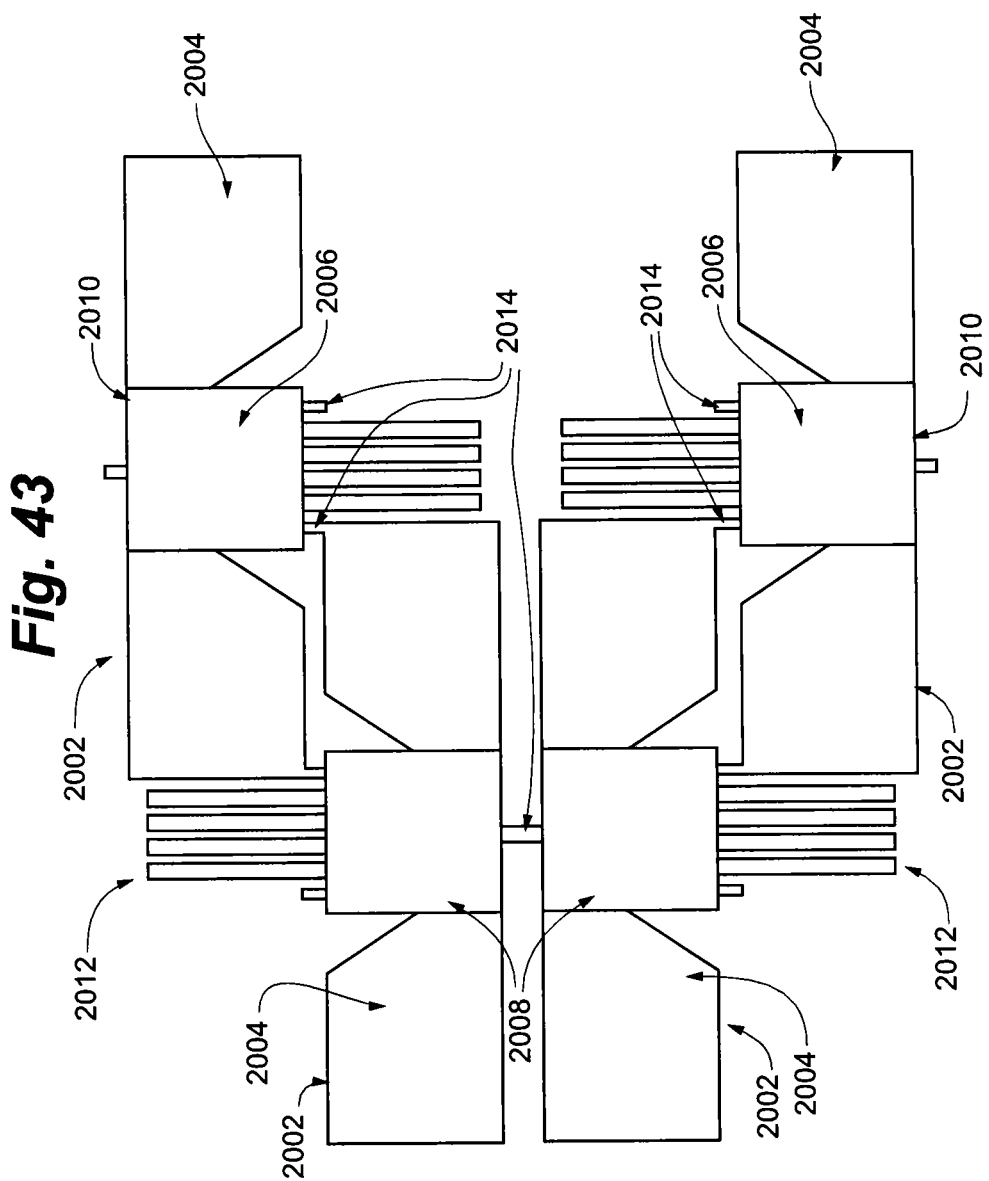

MAGNETIC FIELD CURRENT SENSORS

RELATED APPLICATION

This application claims priority to U.S. Provisional Patent Application Ser. No. 61/138,557, entitled "MAGNETIC FIELD CURRENT SENSORS" and filed Dec. 18, 2008, which is hereby incorporated by reference in its entirety.

FIELD OF THE INVENTION

The invention relates generally to current sensors and more particularly to relatively low-cost integrated current sensors which sense current via an associated magnetic field.

BACKGROUND

Sensor modules with large magnetic cores typically are costly and bulky. An example of such a system 100 is shown in FIG. 1. In FIG. 1, a primary conductor 102 is put through a slit magnetic core 104 which collects all flux around conductor 102 and directs it onto a Hall sensor 106 placed in the air gap 108 of core 104. System 100 and others similar are not differential, which means such systems generally measure the magnetic field only at one location. If a background field is present, it can lead to errors in sensor output; although a significant part of the background field is shielded by the magnetic core, the suppression of background fields is usually not better than a factor of 100. On the other hand, these systems suffer from errors due to core imperfections, such as hysteresis, saturation, shift in offset after large overcurrent events and limited bandwidth due to eddy currents in the core or in the leadframe of the sensor.

Another sensor system 200 is shown in FIG. 2 and includes a sensor integrated circuit (IC) 202 with small magnetic concentrators 204 on top of the die 206. The sensor package 208 is a general purpose type, although package 208 may be modified to use a nonmagnetic copper leadframe material. Sensor IC 202 is placed above or below the primary conductor 210. System 200 is generally small and light-weight but suffers from assembly tolerances because conductor 210 is not integrated into package 208. System 200 also suffers from limited bandwidth due to eddy currents in the leadframe of the standard IC-package 208. Moreover, the suppression of horizontal background fields perpendicularly to the current trace is limited, although system 200 uses differential measurement principles (i.e., system 200 measures the magnetic field at two different places and subtracts one from the other). System 200 also needs a particular technology process to manufacture concentrators 204, which can themselves create additional errors, such as hysteresis and limited overload capability.

SUMMARY

Embodiments related to magnetic current sensors, systems and methods. In an embodiment, a magnetic current sensor integrated in an integrated circuit (IC) and housed in an IC package comprises an IC die formed to present at least three magnetic sense elements on a first surface, a conductor, wherein at least one slot formed in the conductor, wherein a first end of the at least one slot and at least one of the magnetic sense elements are relatively positioned such that the at least one of the magnetic sense elements is configured to sense an increased magnetic field induced in the conductor proximate the first end of the at least one slot, and an electrically isolating layer arranged between the conductor and the IC die.

In another embodiment, a sensor comprises a die having at least three magnetic field sensor elements, an isolating layer coupled to the die, a conductor coupled to the isolating layer opposite the die, wherein at least one void is formed in the conductor inwardly from an edge of the conductor, wherein a first end of the at least one void and at least one of the magnetic field sensor elements are relatively positioned such that the at least one of the magnetic field sensor elements is configured to sense an increased magnetic field induced in the conductor proximate the first end of the at least one void, and signal conditioning circuitry coupled to the at least three magnetic field sensor elements and configured to output a signal related to a sum of magnetic fields sensed by first and second ones of the at least three magnetic sense elements minus two times a magnetic field sensed by a third one of the at least three magnetic sense elements, the third magnetic sense element arranged between the first and second ones of the at least three magnetic sense elements.

In another embodiment, a method comprises providing a magnetic current sensor having three sensing elements linearly arranged with respect to one another and each aligned with an end of one of three slots formed in a conducting portion, sensing, by the at least three sensing elements, an increased current density in at least a portion of the conductor caused by the three slots, and outputting a signal related to a sum of magnetic fields sensed by first and second ones of the three sensing elements minus two times a magnetic field sensed by a third one of the three sensing elements, the third sensing element arranged between the first and second sensing elements.

BRIEF DESCRIPTION OF THE DRAWINGS

The invention may be more completely understood in consideration of the following detailed description of various embodiments of the invention in connection with the accompanying drawings, in which:

FIG. 34B depicts a sensor system according to an embodiment.

FIG. 41 depicts a metal portion according to an embodiment.

FIG. 43 depicts a coupling arrangement of a plurality of current sensors according to an embodiment.

Figure 1:
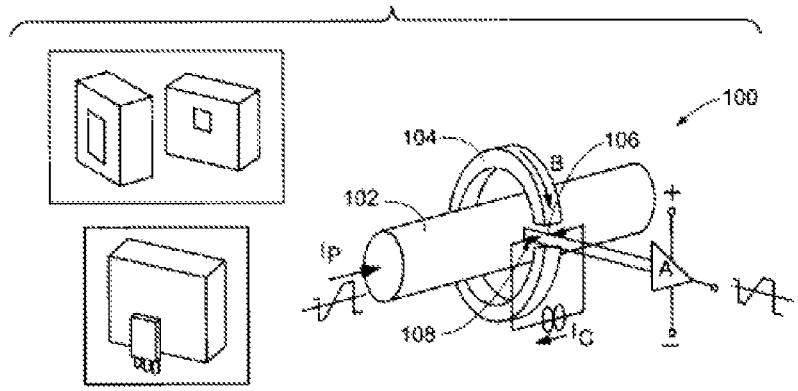
FIG. 1 depicts a conventional sensor system.
Figure 2:
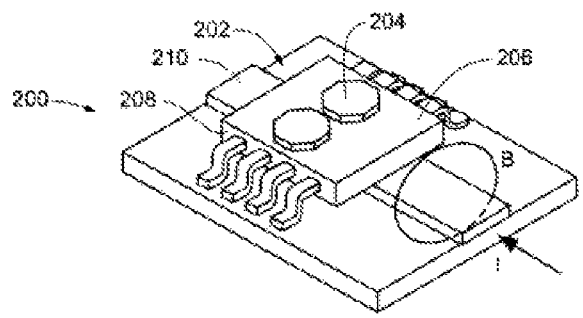
FIG. 2 depicts a conventional sensor system.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

The invention relates to a low-cost integrated current sensor. In one embodiment, a sheet metal element is coupled to at least a portion of a top surface of a sensor die. The sheet metal element forms a conductor for current to be measured by magnetic field sensors, such as Hall elements, on the sensor die via an associated magnetic field, and in one embodiment there is no electrically conductive connection between the sensor die and the conductor. It is advantageous in various embodiments to also use the sheet metal as a leadframe portion for the pins of the sensor die. Electric contact can be established between the sensor die and the pins via through-wafer contacts or via ordinary bond loops in various embodiments. Electric isolation can be accomplished by use of an isolating film, such as a dielectric in one embodiment, on the wafer top side, an isolating die-attach tape or an isolating die-attach adhesive in various embodiments. Structural integrity between the conductor and the die may also be maintained by a floating metal portion on top of the isolating film and soldering of the conductor to the metal.

For example, one embodiment comprises a package and an integrated circuit, and at least a portion of the semiconductor die is covered by an electrically isolating film, on top of which a leadframe is attached. The leadframe can have a sheet metal configuration, meaning that the lateral dimensions are more than about five times larger than the thickness in one embodiment, and the leadframe is not electrically coupled to the bulk of the semiconductor die, providing several kilovolts of isolation voltage. The leadframe can also comprise a contact in order to through-pass a current. Thus, the current can flow in close proximity above the surface plane of the die, such as about 20 micrometers in one embodiment.

In one embodiment, the current sensor comprises a plurality of magnetic sensing elements. In an embodiment, the current sensor comprises at least three magnetic sensing elements. The magnetic sensing elements can comprise planar Hall plates, and the Hall plates can be aligned and in one embodiment are aligned parallel to a general global direction of the line of Hall probes in close proximity to a current sensor that processes the signals of the magnetic sensing elements according to the relationship:

$$S_{total} = S_{left} + S_{right} - 2 * S_{center}$$

in order to suppress not only homogeneous background fields but also fields with linear gradients.

The conductor can be shaped such that, moving along the strongest current line, Hall probes are alternately arranged on the left and right sides. In one embodiment, a generally flat conductor is used, with current flowing in a longitudinal direction relative to the configuration of the conductor, and the conductor can comprise one or more slots formed perpendicular or parallel to the global current direction. In one embodiment, the slots extend approximately from the edge of the conductor to the center line. In other embodiments, one or more slots can extend past the center line or less than to the center line. Other geometric features of the slots can also vary according to embodiments. For example, the slots can be generally longitudinal, have an approximate V-shaped profile, and/or have square or rounded end geometries, among others. Planar Hall probes can be arranged above or below an end of each slot in one embodiment. The conductor may also be extended such that it comprises several layers isolated from each other and connected in series or parallel.

The magnetic sensitivity of the Hall plates of the sensor system can be adjusted to match at least to about one part in 100 in an embodiment, or one part in 10,000 in another embodiment. Embodiments of the sensor system can maintain this matching in spite of temperature and mechanical stress drift throughout the lifetime of the sensor. The sensor system can also use a spinning current technique to reduce the offset down to at least about 100 microteslas (µT) throughout the working temperature range in an embodiment.

Embodiments relate to shapes and configurations of the magnetic field sensors and a primary conductor of a current sensor system, such that the sensor system has one or more advantageous characteristics. In one embodiment, the magnetic field sensors and/or primary conductor can be designed such that a large magnetic field gradient, linear or having a higher spatial derivative, can be generated on the surface of a semiconductor die coupled to the conductor. In an embodiment, the magnetic field can have a major portion perpendicular to the die surface such that a planar Hall sensor element can detect the field and the internal resistance of the conductor is as low as possible. Further, the magnetic field sensors and/or the primary conductor can be designed such that the thermal resistance between points of maximum current density and ambient is as low as possible, and that the mechanical stiffness of conductor and die are maximized. It is also desired that the sensed current not be influenced by nearby currents, or crosstalk and that the conductor not generate a notable field on other components, such as other current sensors nearby. Additionally, the shape of the conductor can be relatively simple and capable of being assembled with packaging, assembling and other procedures commonly used in the semiconductor industry.

The system can comprise a sensor integrated circuit (IC) configured to provide an output signal that includes information about a current flowing through a primary conductor. In one embodiment, there is no galvanic connection between the primary conductor and the sensor IC. To this end, the sensor IC comprises at least one magnetic field sensor configured to respond to the magnetic field originating from the current through the primary conductor. The sensor IC is held in a well-defined position with respect to the magnetic field of the conductor. In one embodiment, the magnetic field of the conductor is not further amplified or collected by a magnetic fluxguide circuit, such as a soft magnetic material, because this could increase cost and weight and reduce accuracy. In other embodiments, however, it may be advantageous to integrate one or more small magnetic flux guides into the sensor package, such as sputtered on top of the die.

In various embodiments, the sensor signal advantageously has only a small additive error, or offset. In one embodiment, the sensor signal is zero at zero amps, with as small an error as possible. The sensor signal advantageously also has only a small gain error. For example, at full scale current the output should stay constant versus temperature and lifetime. The sensor signal also have a bandwidth that ranges from DC to about 100 kilohertz (kHz) or higher, as well as a small reaction time, such as about one microsecond (µs) in one embodiment.

In one embodiment, the nominal current range is about one amp (A) to about one kiloamp (kA). The current sensor has a small size with respect to volume and footprint in various embodiments and is also light-weight, but remains robust against external magnetic fields, temperature, moisture, overload current through the primary conductor, and voltage swing between the primary conductor and the ground of the sensor IC. In one embodiment, the current sensor can withstand a current that is about ten times or more of the nominal current. The voltage isolation between the primary conductor and the sensor IC is on the order of kilovolts in various embodiments. The current sensor also has low power consumption, such as less than about 50 milliwatts (mW) in one embodiment, and low power dissipation in the primary conductor. Over-temperature due to self-heating of the sensor is also low in embodiments.

The output signal of the sensor IC can comprise an analog voltage or current, a frequency, a pulse-codemodulated or pulse-width-modulated wave, a digital code or some other signal form. As mentioned above, the sensor output signal can convey information about the current, such as magnitude of the current, flow direction, phase, frequency, harmonic content and frequency spectrum, time integrals or time derivatives thereof, and other information.

The sensor system is fabricated according to a standard CMOS process combined with advanced packaging technology in one embodiment. This combination enables use of a single type of silicon die, and therefore a single layout, for a wide range of current sensors.

In one embodiment, the leadframe can be omitted, which avoids induced eddy currents and bandwidth limitations. Because the current to be measured needs a primary conductor, the primary conductor can be used in one embodiment as a leadframe surrogate. Note that eddy currents induced in the primary conductor do not disturb the magnetic field sensor but do increase the impedance of the primary conductor, which is driven by a strong generator. By way of finite-element simulations, it can be demonstrated that a sensor die attached to an ordinary copper leadframe having a thickness of about 0.2 millimeters (mm) and placed near a conductor has a −3 dB bandwidth of 15 kHz due to eddy currents induced by the field of the conductor in the leadframe. If the current passes through the leadframe itself and there is no other good conductor close to the magnetic field elements, the bandwidth increases far above 100 kHz.

Because the die is attached to the primary conductor and not connected to ground of the sensor circuit, there is an additional advantage in that all pins of the sensor circuit are connected via thin bond wires. Therefore, if a short accidentally happens between the primary conductor and any of the pins of the sensor circuit, this short cannot transfer a large amount of power because the thin bond wire acts as a fuse, which is quickly blown.

Figure 3:
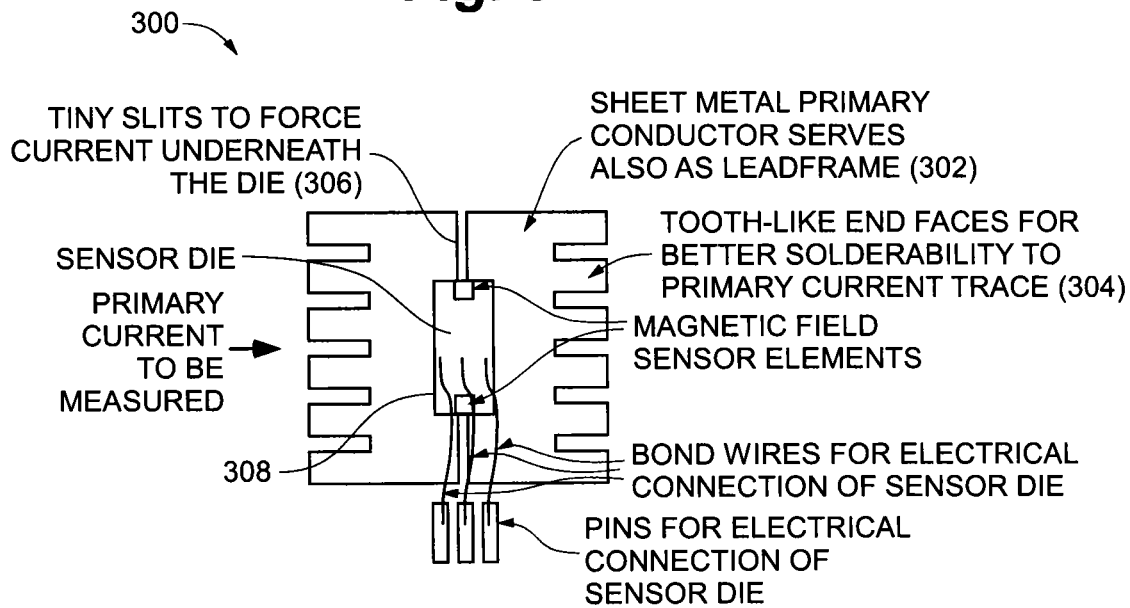
FIG. 3 depicts a sensor system according to an embodiment.

The primary conductor can also be designed such that it maximizes the current density near the magnetic field sensors, thus increasing the magnetic field on the sensor elements. In one embodiment, the primary conductor comprises a plurality of very small slots in a sheet metal primary conductor, such as is depicted in FIG. 3. In FIG. 3, a sensor system 300 comprises a leadframe 302 which serves as the primary conductor and in which the current flows from left to right as depicted. Leadframe 302 comprises a plurality of extensions or teeth 304 which serve as pins of the primary conductor. Extensions 304 can be soldered to the bus-bar where the primary current flows in one embodiment and can also be bent by 90 degrees. In various embodiments, extensions 304 can also comprise apertures, slots or other configurations in order to couple the conductor to the bus-bar.

Leadframe 302 also comprises first and second slots 306. In one embodiment, slots 306 are vertically arranged above and below the die 308 in order to "squeeze" the current underneath die 308 and can have a width of about 0.1 mm or as small as is possible according to manufacturability and to maintain structural integrity. If leadframe 302 is relatively thick, it may be difficult to manufacture very narrow slots 306. For example, if leadframe 302 is about 5 mm thick, it may be difficult to make slots 306 only about 0.1 mm wide, and slightly larger slots 206 may be more practical. On the other hand, certain forces may be applied to leadframe 302 in practice, which can cause bending and distortion. Such forces may result from bolting or otherwise coupling leadframe 302 to a bus-bar or from the current flow itself. Thus, the width of slots 306 should be large enough to ensure that in spite of all forces the two opposing edges of each slot 306 do not come into contact, which would shunt a significant portion of the current away from die 308 and lead to large errors in the measurement. In order to avoid these shorts it may be advantageous to insert some kind of slim isolation material into one or both slots 306. In one embodiment, this can be done by covering slot 306 with a mold compound.

Figure 4:
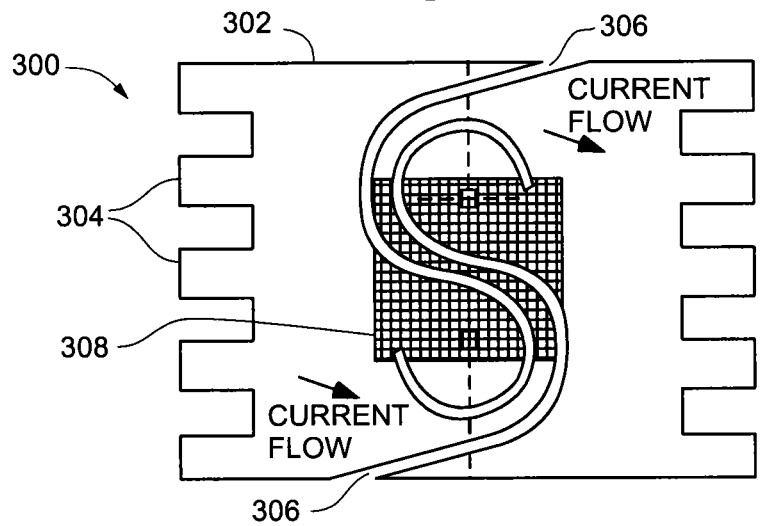
FIG. 4 depicts a sensor system according to an embodiment.

In the embodiment of FIG. 4, the current also generally flows from left to right with respect to the orientation of system 300 on the page, and slots 306 have a curved configuration for the current path underneath die 308.

Figure 5:
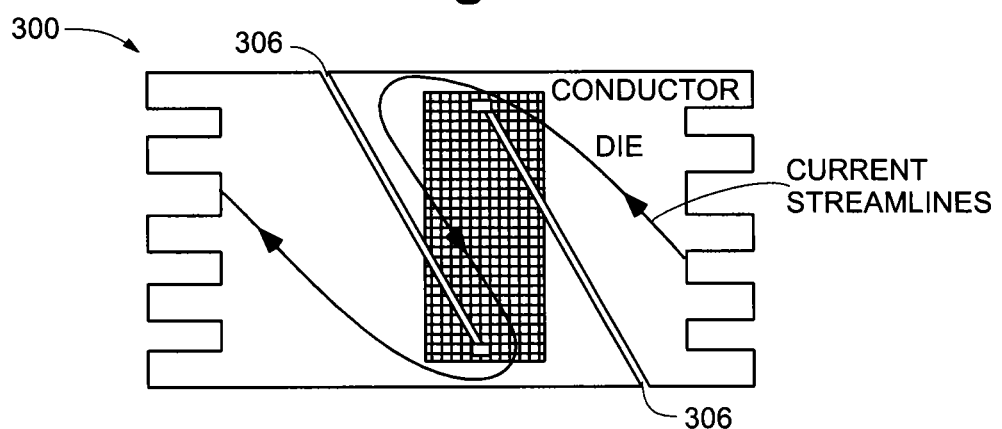
FIG. 5 depicts a sensor system according to an embodiment.

In the embodiment of FIG. 5, the current flows from right to left with respect to the orientation of system 300 on the page, and another configuration of slots 306 is depicted.

Figure 6:
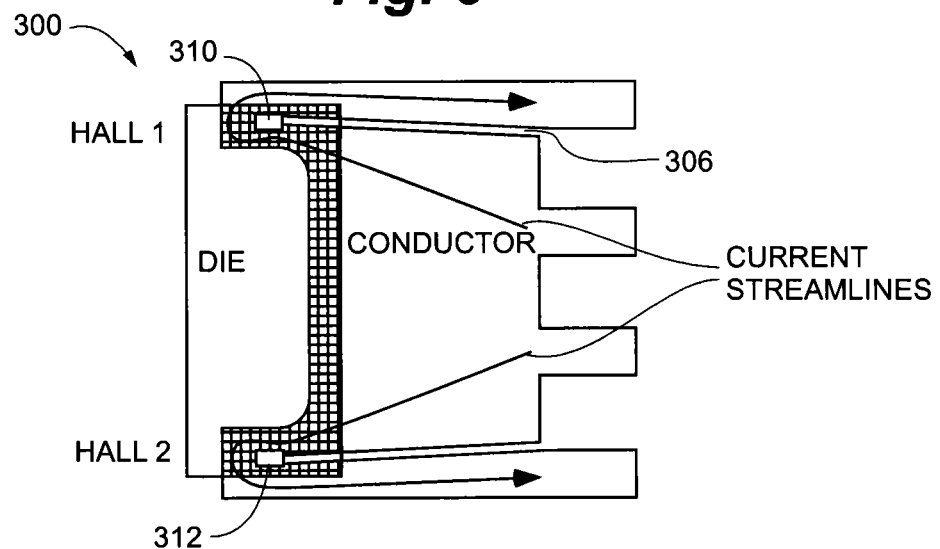
FIG. 6 depicts a sensor system according to an embodiment.
Figure 7:
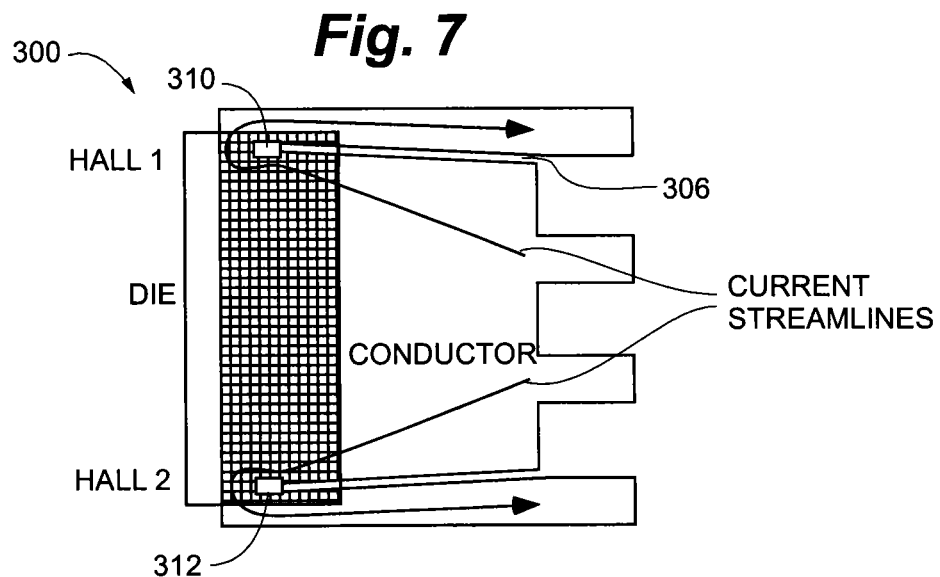
FIG. 7 depicts a sensor system according to an embodiment.

In the embodiments of FIGS. 6 and 7, the current is split into two parts, one flowing around an upper Hall probe 310 and the other flowing around a lower Hall probe 312. While Hall elements can be used in one embodiment, other magnetic field sensing elements can be used in various other embodiments. This geometry enables mounting of sensor system 300 in an upright position, which can save space in certain applications.

Figure 8:
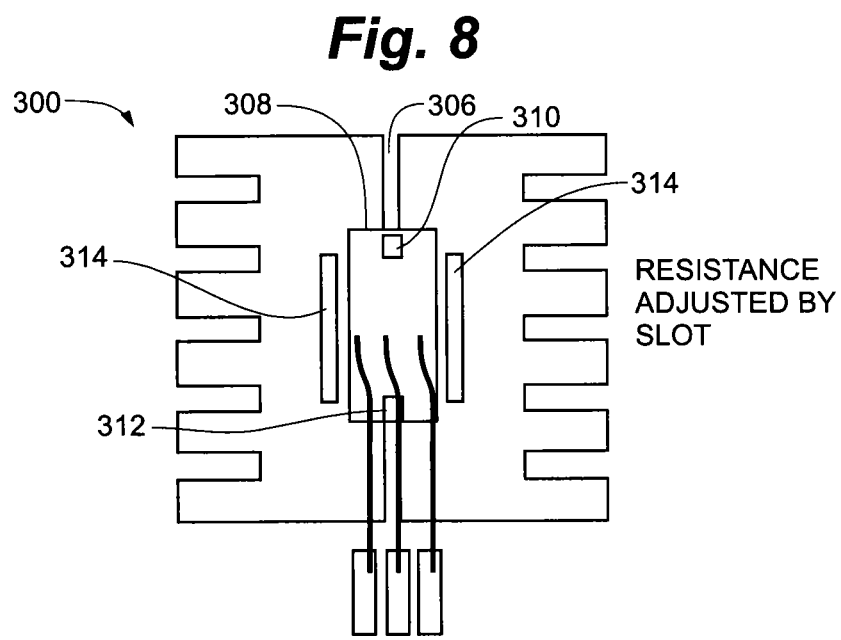
FIG. 8 depicts a sensor system according to an embodiment.

Additional slots can further increase the current density, as shown in FIG. 8. For example, longitudinal slots 314 can be formed along the sides of die 308 and block the current lines from passing through underneath. This forces the current around Hall probes 310 and 312, providing higher magnetic fields there. Other shapes, configurations and placements of slots 314 can be implemented in various embodiments. The embodiment depicted in FIG. 8 can have applicability when power dissipation is a lesser concern, such as for lower current ranges on the order of about 10 A.

Figure 9:
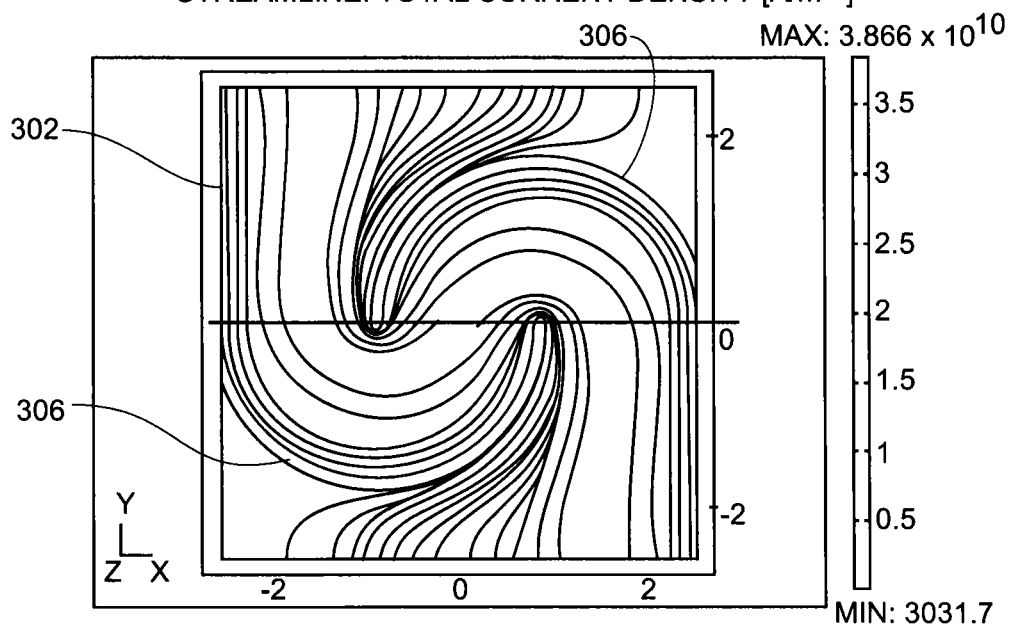
FIG. 9 depicts a sensor system according to an embodiment.
Figure 10:
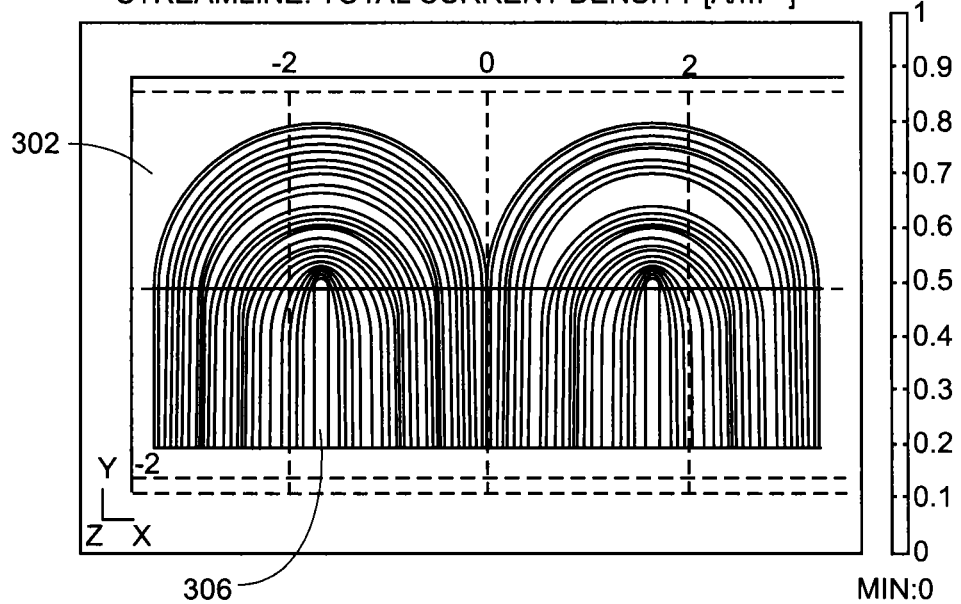
FIG. 10 depicts a sensor system according to an embodiment.

FIG. 9 depicts a leadframe 302 in which the current is flowing from bottom to top with respect to the orientation of the figure on the page. FIG. 10 depicts a leadframe 302 in which the current is flowing from bottom to top and back to bottom with respect to the orientation of the figure on the page. FIGS. 9 and 10 depict the leadframes 302 with slots 306 but do not show the sensor die and Hall probes. At the end of each slot 306 is a Hall probe (not shown), such that both systems have two Hall probes each subjected to magnetic fields of different signs. This enables differential measurement, where both signals are subtracted to cancel background interference.

Slots 306 provide a number of advantages. Wherever a narrow slot forces the current lines to change direction abruptly, the current density increases significantly. This makes the slots particularly useful for shaping inhomogeneous patterns of current density and thus magnetic field. Thus, the slots can increase the current density only at particular places where it is needed, such as near a magnetic field sensor, while at the same time keeping it low everywhere else, providing low impedance and low power dissipation.

Figure 11:
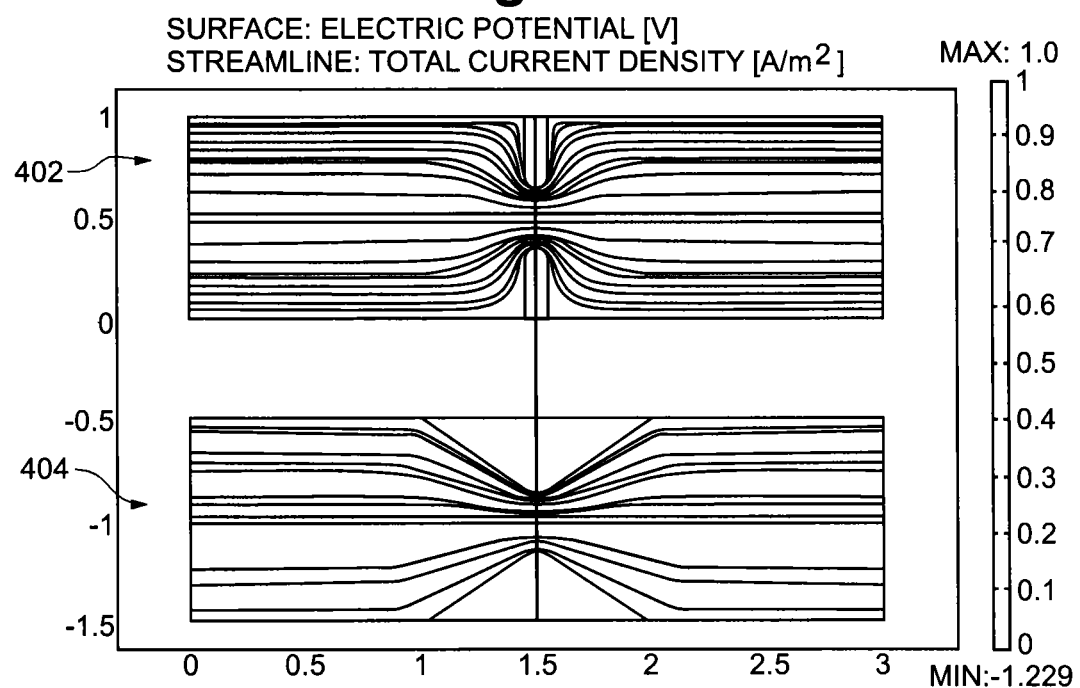
FIG. 11 depicts a current diagram comparison according to an embodiment.
Figure 12:
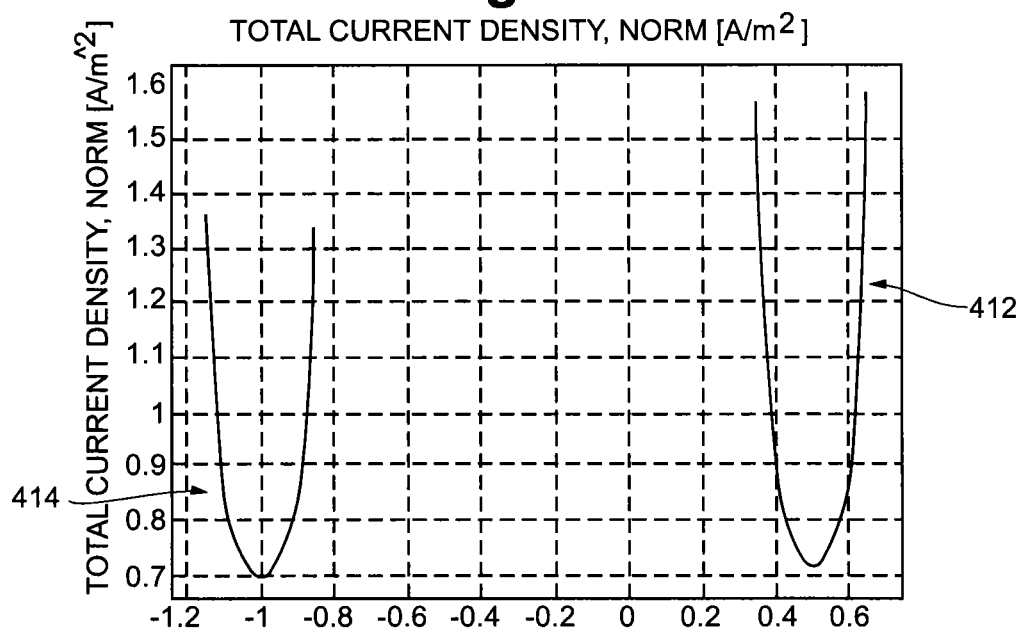
FIG. 12 depicts a current density comparison according to the embodiment of FIG. 11.

FIG. 11 depicts a current pattern comparison of a conventional sensor system at 404 and according to an embodiment of the invention at 402. The pattern at 402 has an internal resistance of 3.696 squares, while the pattern at 404 has an internal resistance of 3.992 squares, which is 8% higher. FIG. 12 depicts the current density along the red line shown in FIG. 11. Thus, the left curve 414 is the current density in the narrow region of the lower conductor 404 and the right curve 402 is the current density in the narrow region of the upper conductor 412. The voltage across each conductor 402, 404 is 1V, the conductivity 1 S/m and the thickness 1 m (lateral dimensions given in meters for the sake of convenience). It can be seen that not only does the upper conductor of 402 have 8% lower resistance, it also has larger inhomogeneity of current density near the ends of the slots, which is where magnetic field sensors can be located. Thus, narrow slots can be more efficient in directing the current close to the magnetic field sensors and increasing the current density locally while keeping the internal resistance and the power dissipation to a minimum.

The slots also shape the current flow without overly reducing the thermal conductivity and thermal mass of the conductor. Thermal conductivity is important because at high currents it is generally unavoidable that the primary conductor dissipates significant power. For example, the conductor could be designed to have 100 µOhm resistance; at 100 A this dissipates 1 W, at 200 A 4 W, and at 317 A 10 W. The thermal mass is important for the sensor to withstand short over-current events. For very short events the complete dissipated power is used to heat the mass, so if the mass is large it takes longer to reach high temperatures.

Figure 13:
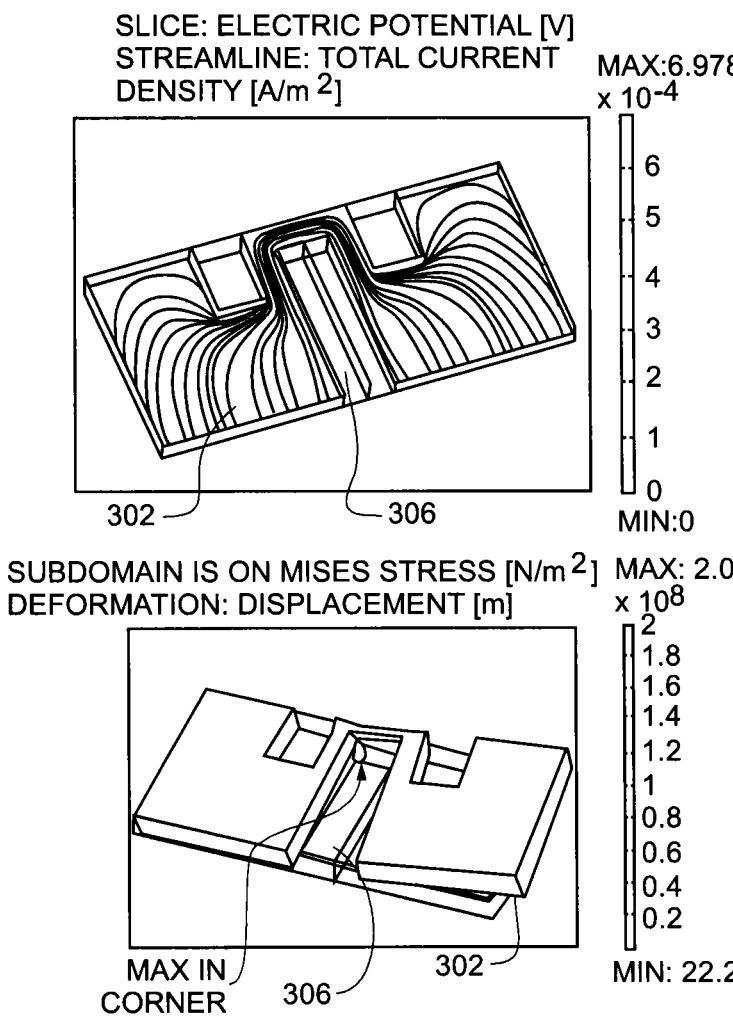
FIG. 13 depicts a conductor current flow according to an embodiment.

The slots also do not reduce the structural integrity of the conductor. Because there are large forces acting on the conductor at high currents, e.g. over-currents, the conductor needs to be strong. FIG. 13 depicts an example of a conductor 302 with the current flowing in the shape of a "U" and the resulting deformation. The current tries to open up the main slot 306, because the current is flowing in the opposite direction along the two edges of slot 306 and opposing currents repel each other.

Figure 14:
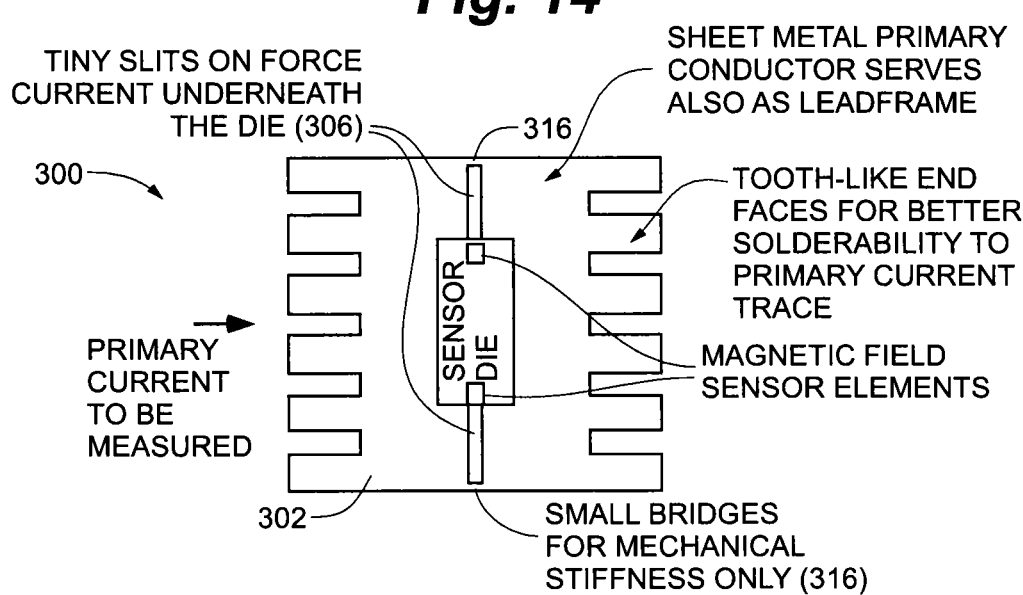
FIG. 14 depicts a sensor system according to an embodiment.

The slots do not significantly reduce the surface of the conductor, so there is still enough interface surface to bond or couple the die and the conductor together, which is generally done to define a distance between the die and the conductor. Moreover, if a silicon die is coupled on top of or below the leadframe, the structure may become stiffer, thereby reducing deformation. To increase mechanical stiffness, a relatively thick semiconductor die can be used, or one or more thin bridges 316 can be added at the outer ends of slots 306, although such bridges 316 should be designed in one embodiment to short only a small amount of primary current, as depicted in FIG. 14. Note that the entire leadframe 302 comprises mainly the primary conductor, however, also the pins of the sensor IC.

In various embodiments, it may be advantageous to use different thicknesses for the pins and the primary conductor, such as a thin sheet metal about 0.2 mm thick for the pins of the sensor (supply, ground, output and optional additional signaling input/output pins), and thicker metal for the primary conductor, such as about 1 mm thick, in one embodiment. This can be accomplished with a single piece of metal or by using a thin sheet of metal and welding, hard soldering, and/or gluing additional thicker parts to the primary conductor portion of the leadframe. In an embodiment, ultrasonic welding is used, which provides a benefit of not needing an additional material, which may have a different coefficient of thermal expansion and thus be prone to fracture under thermal cycling, to join the parts. In embodiments using glue, the glue generally is electrically conducting. The thicker parts of the leadframe may be attached to the thinner parts prior to die attachment, such as at the site of the semiconductor manufacturer, or by a customer or other end user after the device has been delivered from the manufacturer.

Figure 15:
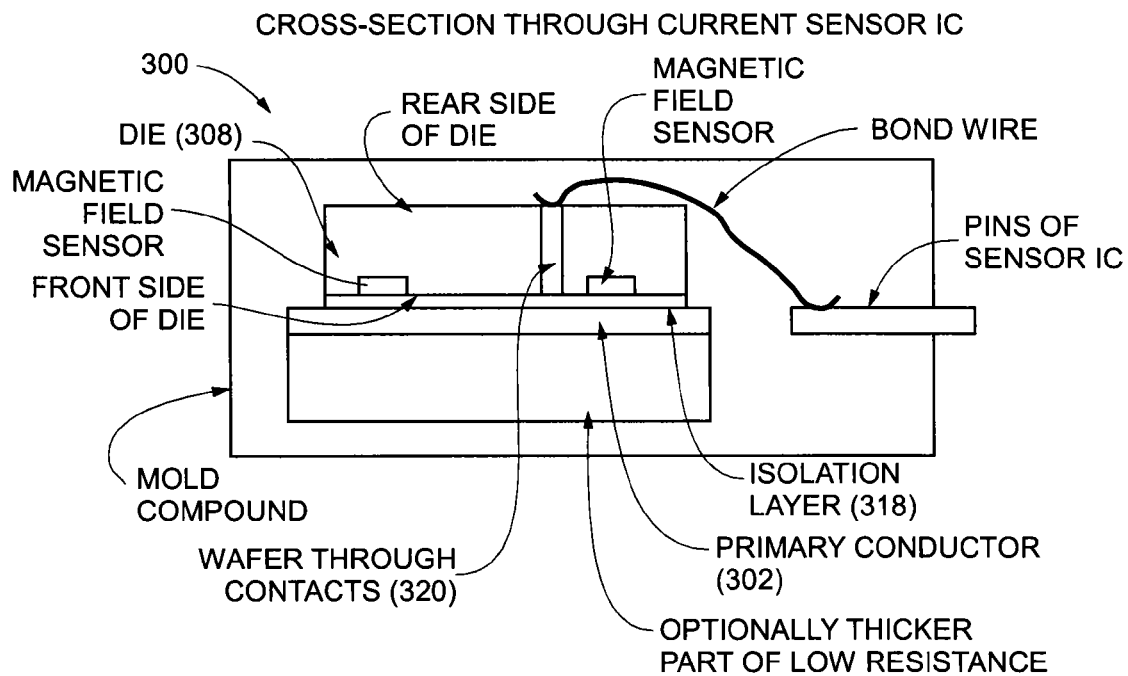
FIG. 15 depicts a cross-section view of a current sensor integrated circuit according to an embodiment.

Because there generally is no magnetic material acting as a flux concentrator, the magnetic field sensors should be as close as possible to the surface of the conductor in one embodiment. Therefore, and referring to FIG. 15, conductor 302 is coupled to the upper side of die 308 in one embodiment, in contrast with the common practice in which the leadframe is attached to the rear side of the die. In order to have enough isolation voltage, die 308 can be coated with an electrically isolating film 318 of appropriate thickness and electric field strength. There are generally two options for supplying the sensor with electrical energy: by wafer through-contacts or by bond loops. If the entire surface of die 308 is covered by conductor 302, wafer through-contacts 320 can be used, as shown in FIG. 15. Wafer through-contacts 320 can be used to connect the sensor circuit to a power supply and to bring the output signal from the sensor to the pins of the sensor IC. Thus, there are typically three contacts: supply, ground and output, and each typically conducts only a few milliamps. In one embodiment, the primary current to be measured does not pass through wafer through-contacts 320. FIG. 15 shows only one single wafer through-contact 320 for the sake of convenience, while a typical sensor IC would usually have at least two, for electrical supply, or three or more, for additional input/output signal lines, in various embodiments.

Figure 16:
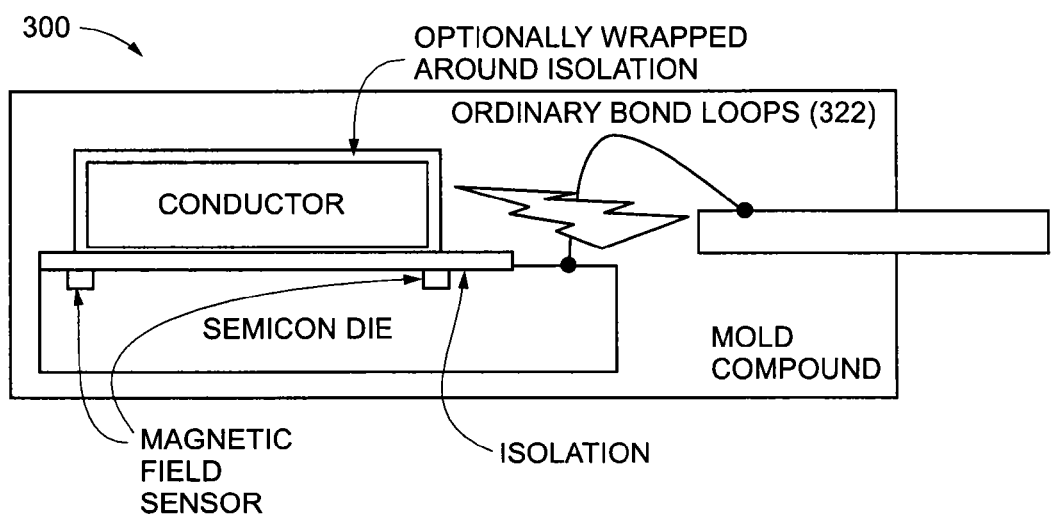
FIG. 16 depicts a cross-section view of a current sensor integrated circuit according to an embodiment.

If only a portion of the die surface is covered by conductor 320, ordinary bond loops 322 can be used in other embodiments, as depicted in FIG. 16. Care should be taken to achieve the required voltage isolation between the primary conductor and the pins of the sensor. Thus, an additional isolation can be wrapped around the primary conductor in one embodiment. This isolation can comprise, for example, a foil such as KAPTON or ARAMID or a coating of a heat resistant isolating enamel or other material.

The isolation can also be accomplished with a thin film in other embodiments, which can be grown on top of the wafer as one of the last front-end process steps. In yet another embodiment, a final isolation layer can be grown after dicing in order to cover the complete die except for bond areas and those areas where the primary conductor may be soldered to the top metal layer. The conductor can then be glued onto the isolation film with a die attach adhesive. If the requirements for voltage isolation are lower, the isolation capacity of the die attach adhesive may be sufficient. However, the isolation may also be accomplished by gluing the die onto the conductor with an electrically insulating tape. In one embodiment, a floating metal layer can be grown on top of the isolating film in the front-end process and the conductor soldered onto this metal layer. It can also be useful in one embodiment to connect the floating metal layer electrically to ground in these regions of the wafer, which are cut out during dicing, so that no excessive potential may develop between the layer and other parts of the wafer during manufacturing. The floating top metal layer can cover a major portion of the chip area; however, it may be advantageous to pattern the layer into smaller portions to reduce build-up of mechanical stress between the conductor and the silicon die. Thus, one or more additional stress relieving layers can be formed between the top metal layer and the silicon die. Additionally, if there is no top isolation layer, such as can be used for soldering to primary conductor, 302, it may be advantageous to form one or more stress isolating layers on top of the die. In another embodiment, this metal layer can be patterned in order to guide the current close to the Hall probes and to provide large areas for soldering low-ohmic contact pins. Such an embodiment is depicted in FIG. 17.

Figure 17:
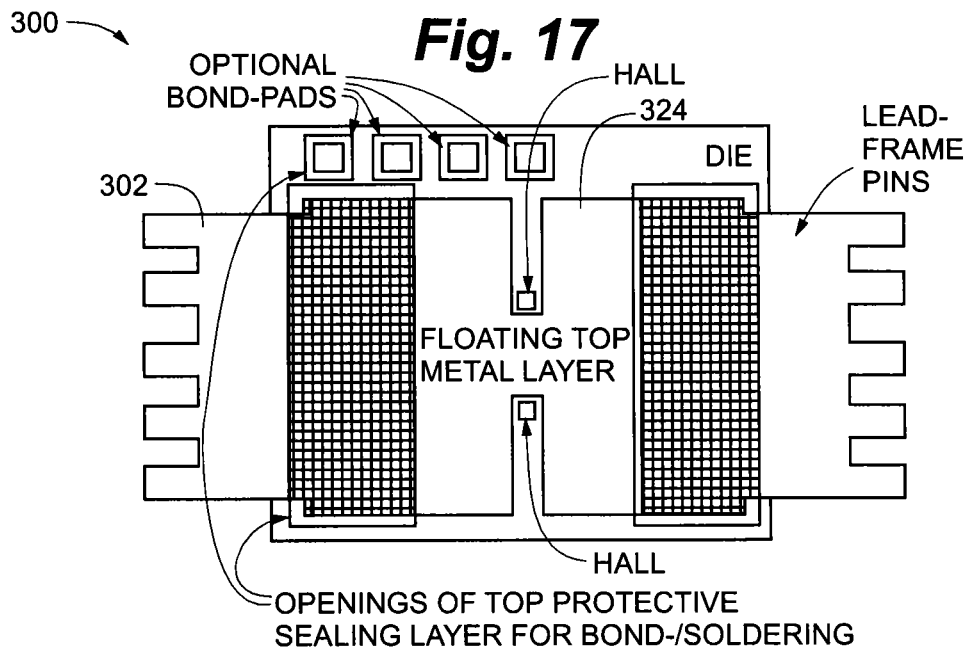
FIG. 17 depicts a sensor system according to an embodiment.

An advantage of system 300 depicted in FIG. 17 is that floating top metal layer 324 can be positioned accurately with respect to the Hall plates. Leadframe 302 generally cannot be positioned as accurately. External connections can be done by the two leadframe parts 302 with pin-extensions, which typically need only make sufficient contact to floating top metal layer 324. Moreover, those parts of the top metal layer 324 and the rest of the die which are not needed for contact with leadframe 302 can be covered by any kind of standard protective layer in order to make the die more robust with respect to environmental influences. Another advantage of the embodiment of FIG. 17 is that the larger interface area between top metal layer 324 and leadframe 302 provides a low thermal path to ambient temperature in one embodiment.

Figure 18:
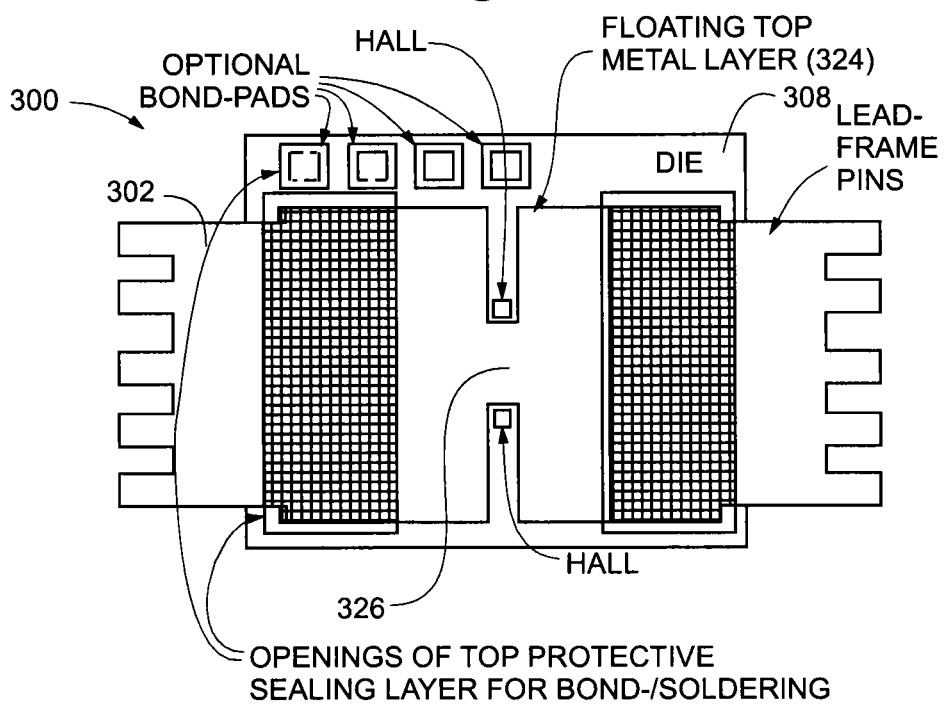
FIG. 18 depicts a sensor system according to an embodiment.
Figure 19:
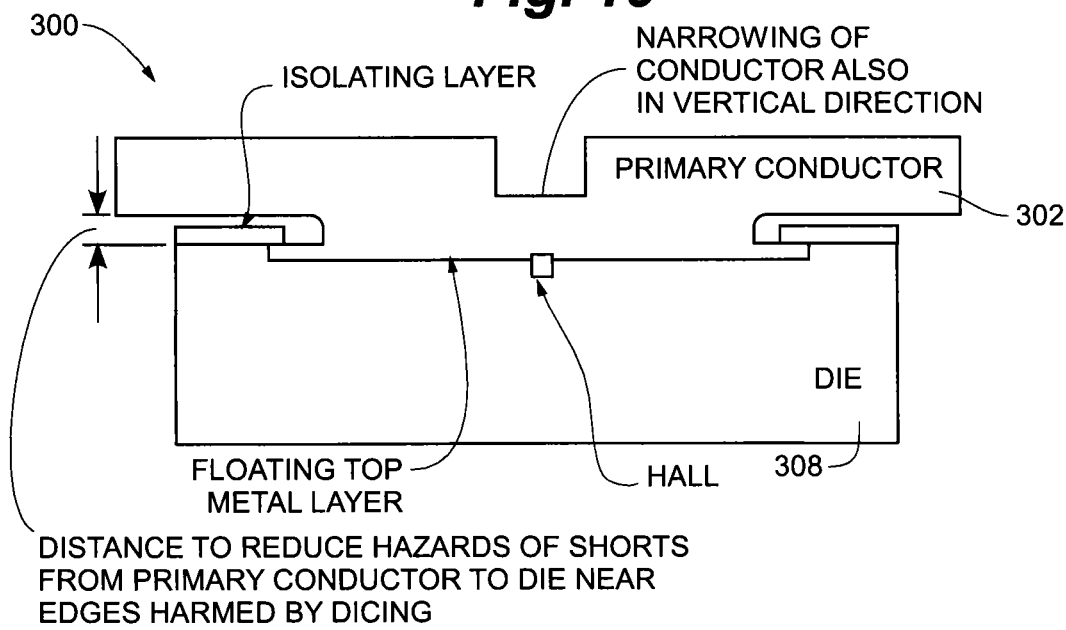
FIG. 19 depicts a sensor system according to an embodiment.

It can also be advantageous in various embodiments to form primary conductor 302 from a single piece narrow enough to be within the outer contours of floating metal layer 324, even in its narrow region and despite position tolerances, as depicted in FIG. 18. In FIG. 18, left and right portions of primary conductor 302 are connected by a bridge 326, which is thinner in terms of lateral extensions in one embodiment than top metal layer 324. Bridge 326 can help to keep the internal resistance low and can also have a positive side effect of increasing the stiffness and the relative position of left and right parts of primary conductor 302. Floating top metal layer 324 can be used to couple conductor 302 to die 308 in one embodiment and to draw a portion of the current into layer 324, thus very close to the magnetic field sensors. In one embodiment, thick parts of the leadframe 302 cover more than the openings which define the soldering area, and it can be advantageous if they cover a large part of the die in order to dissipate power away from the die. FIG. 19 depicts a cross-sectional view of one embodiment of system 300.

Figure 20:
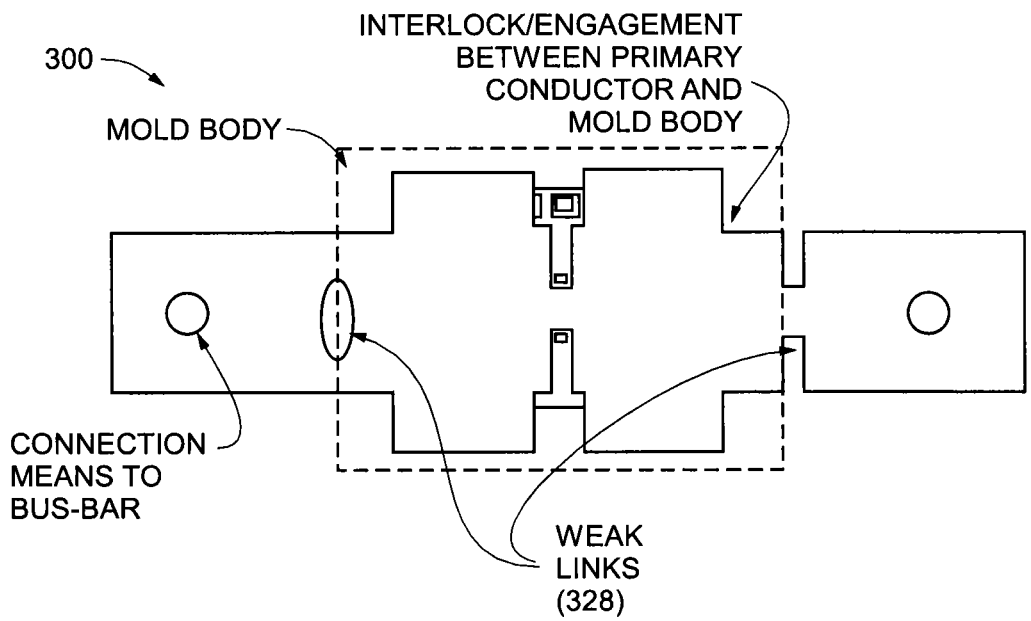
FIG. 20 is a cross-section view of a sensor system according to an embodiment.

Referring to FIG. 20, the stack, from the silicon die to the conductor, is covered with a mold compound in one embodiment. The mold compound protects sensitive edges of the die and the bond loops and helps to anchor the pins of the sensor IC. Moreover the mold body can be designed to engage with the primary conductor so that forces between the conductor and the sensor package are taken up by the mold compound to prevent the die from cracking or otherwise being damaged. In one embodiment, the conductor comprises a fishplate configured to interlock with the mold to establish a tight form closure.

Figure 21:
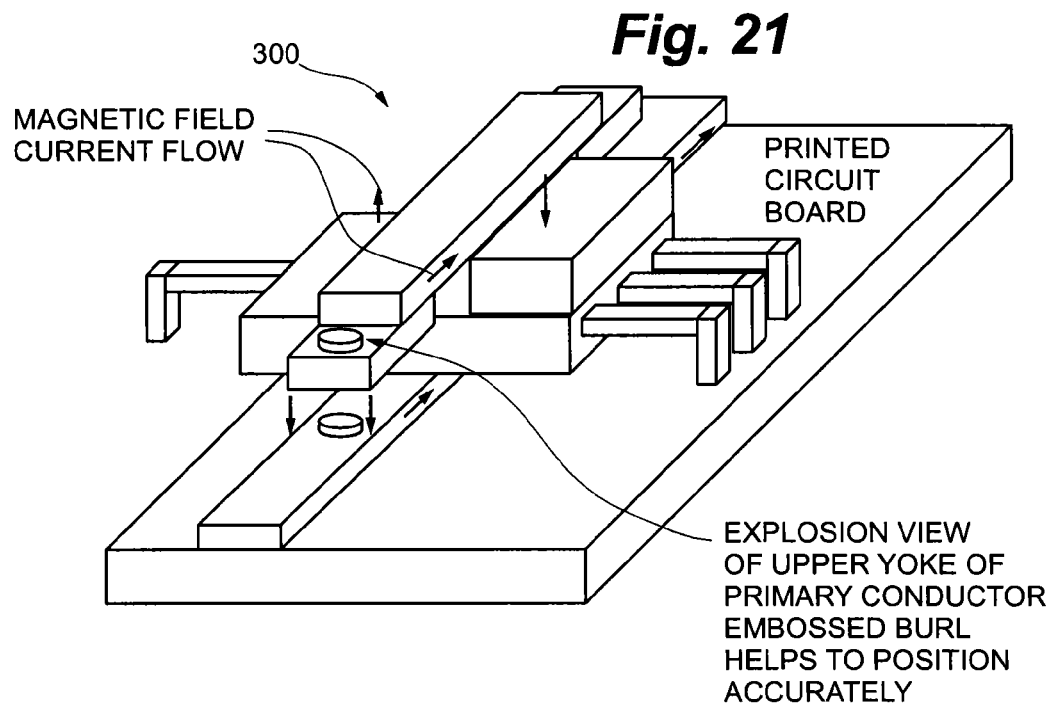
FIG. 21 depicts a sensor system according to an embodiment.

To prevent the die from being harmed by forces transmitted from other components through the conductor, such as high currents if the conductor comprises a bus bar, the conductor can comprise one or more stress elements 328 configured to absorb small deflections. Such a stress element 328 can comprise an aperture, notch, slot or other configuration in the conductor so that only a portion, for example 50% or less, of the conductor cross-section remains in one embodiment. Stress element 328 can be used for centering a second conductor with respect to the first, as is shown in FIG. 21.

To increase the strength of attachment between the conductor and the die, it can be advantageous to supply the conductor along this interface with dimples, mold locks or other elements. It may also be advantageous to shape the mold body such that a second sensor can be placed next to it with minimum crosstalk, such as at right angles in one embodiment. The mold body should also be shaped such that a second conductor can be positioned electrically parallel to the first conductor to reduce internal resistance and increase the current range of the sensor. As the first conductor passes over the surface of the die, the second conductor could pass behind as shown in FIG. 21.

Figure 22:
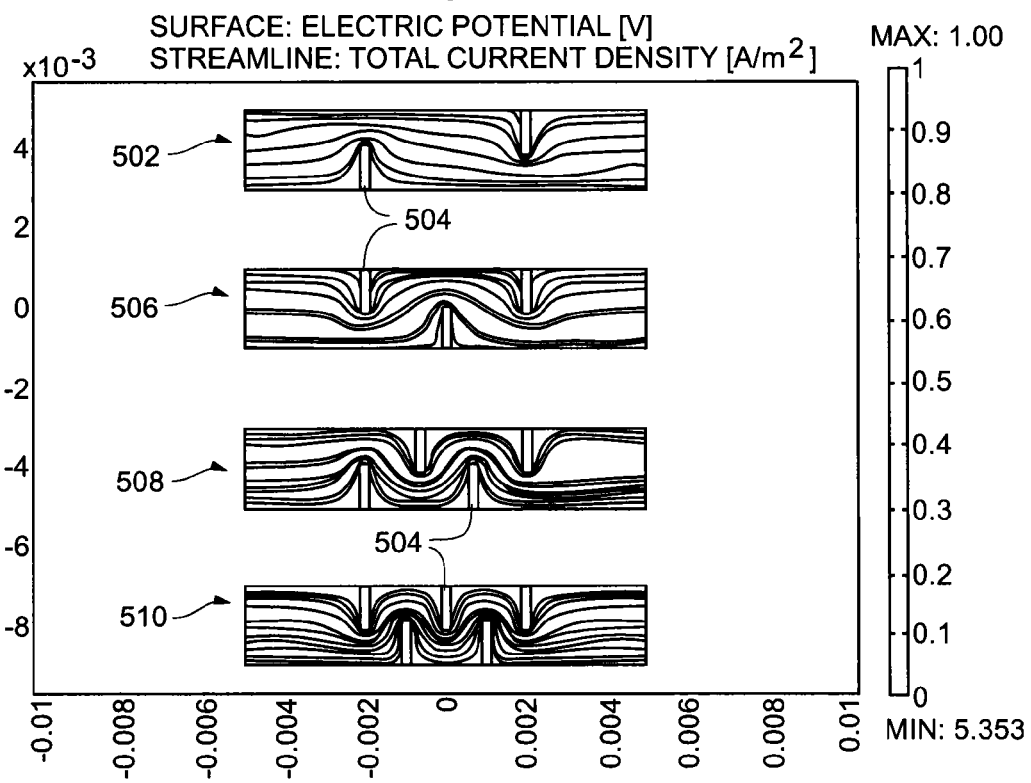
FIG. 22 depicts conductors according to embodiments.

Referring to FIG. 22, embodiments can comprise a plane strip of conductor comprising one or more contact elements such that the current passes parallel to a longitudinal side of the strip. In one embodiment, the strip comprises a plurality of narrow slots formed perpendicular to the longitudinal side and across about half of a width of the strip. In FIG. 22, four embodiments are depicted. Strip 502 comprises two slots 504, strip 506 comprises three slots 504, strip 508 comprises four slots 504, and strip 510 comprises five slots 504. Regarding the resulting current flow lines, the number of squares of the internal resistance generally increases only moderately with the number of slots, as shown in the following table:

| Number of Slots | Squares |
| --- | --- |
| 0 | 5 |
| 2 | 6.5 |
| 3 | 7.3 |
| 4 | 8.6 |
| 5 | 10.3 |

Thus, in one embodiment, the internal resistance approximately doubles with five slots (strip 510) versus a strip with no slots.

Figure 23:
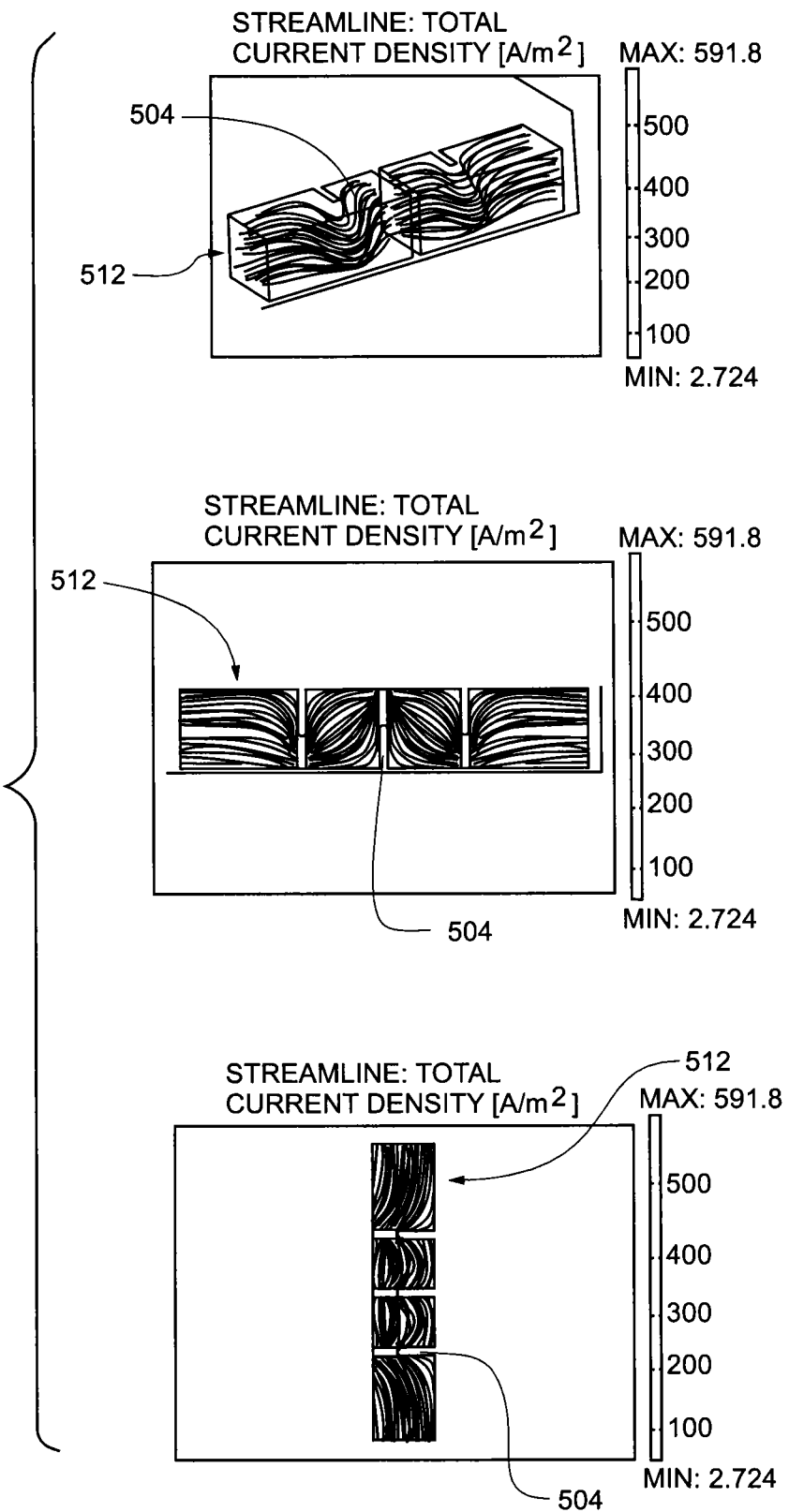
FIG. 23 depicts conductors according to embodiments.

This principle may also be extended into three dimensions, as depicted in FIG. 23. In the top view of FIG. 23, the x-coordinate runs left to right, y into the page and z bottom to top with respect to the orientation of the figure on the page. In the lower left view of FIG. 23, x-y is shown, while in the lower right view z-x is depicted. Conductor 512 can be coupled to the top of a sensor die.

Figure 24A:
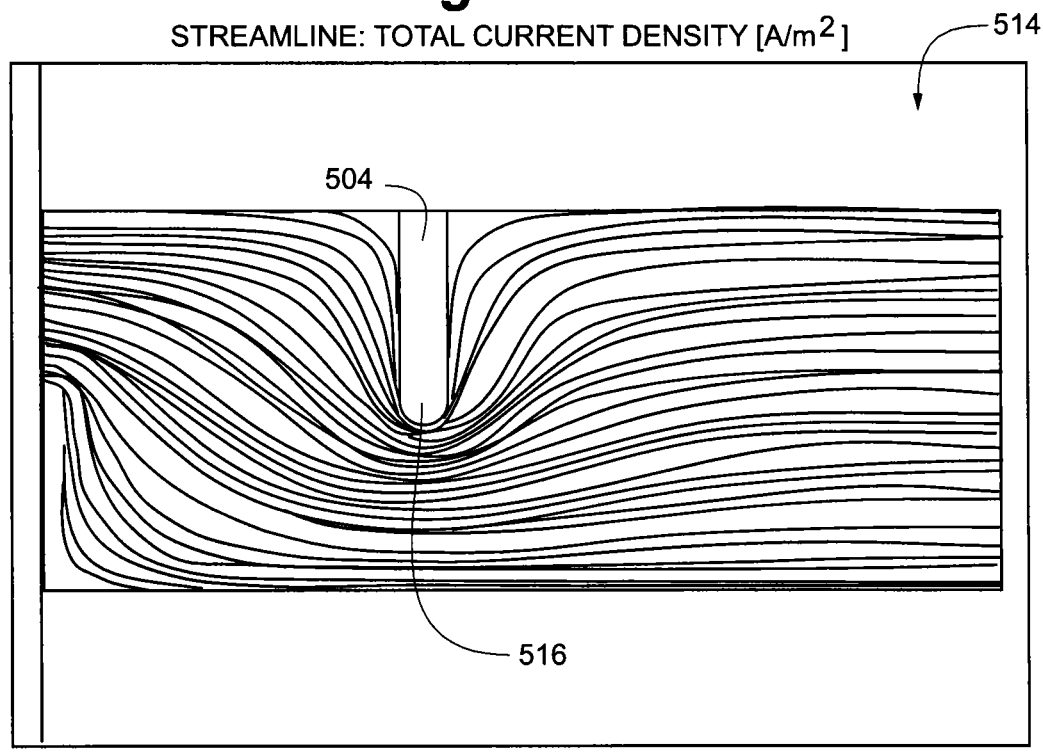
FIG. 24 depicts a conductor according to embodiments.
Figure 24B:
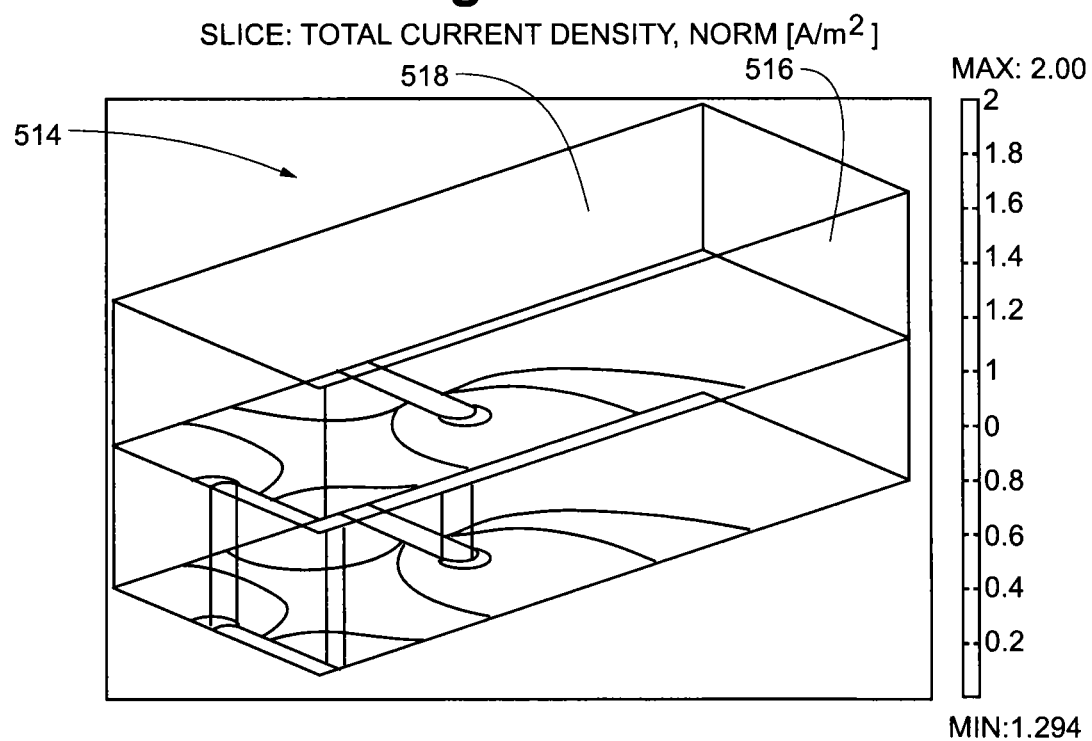

FIG. 24 depicts a plane strip of conductor 514 having three slots 504. Because of the symmetry, only the right upper half of conductor 514 is depicted. Each slot 504 has a rectangular shape with a curved end in one embodiment and extends to the center line of strip 514. FIG. 24A shows current streamlines running left to right with respect to the orientation of the page, and FIG. 24B shows the current density in the midplane and on the surface of conductor 514.

As can be seen, the current density is increased near the end of each slot 504. The curved configuration of the end of slot 514 keeps the current density from unduly increasing in one embodiment, and the current density can reach or exceed about 1000 $A/mm^2$ in one embodiment. It is generally not desired to further increase the current density, because at about 100,000 $A/mm^2$ even copper shows stress degradation due to electromigration. Another challenge is preventing local over-heating of conductor 514, which can lead to the current flowlines changing path around the corners because of locally increased resistance, thereby giving rise to a nonlinear dependence of field versus current. This effect can also relate to a time-dependence of the current. These and other undesirable effects can be reduced or eliminated by rounding the end of slots 504 in embodiments, as depicted in FIG. 24.

Figure 25A:
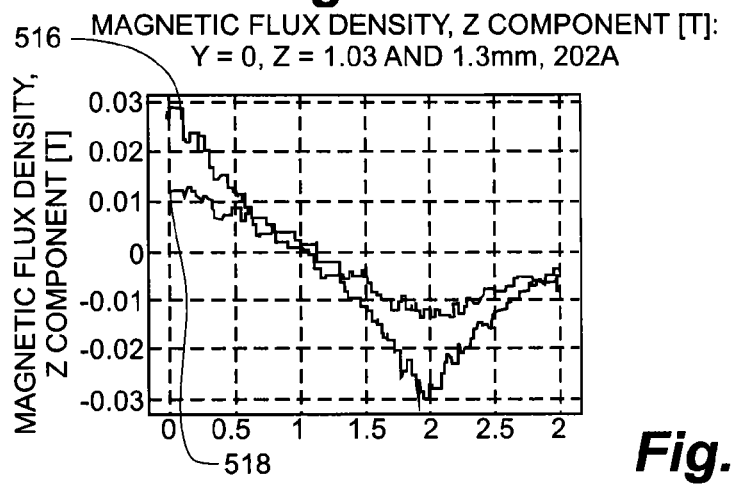
FIG. 25 depicts magnetic field components according to an embodiment.
Figure 25B:
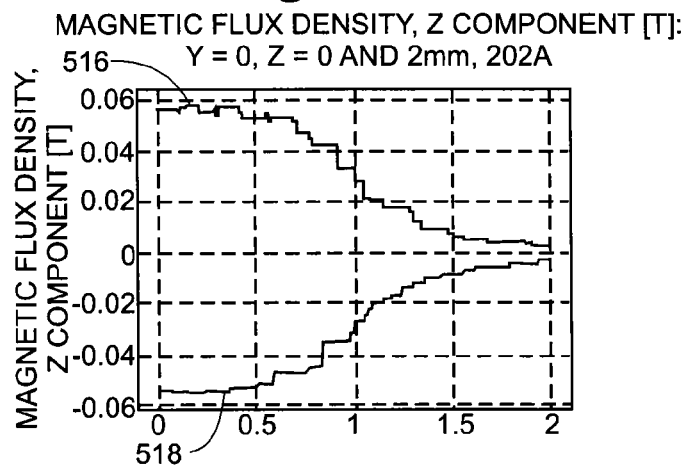

FIG. 25A depicts vertical field component $B_z$ (note the system of coordinate axes in the FIG. 24) along the line 516 in FIG. 24. In one embodiment, line 516 is about 30 µm above conductor 514, and line 518 is about 300 µm above conductor 514. FIG. 25B depicts a scan of $B_z$ in the vertical (z) direction, with line 516 at x=2 mm where the right slot 504 is, and line 518 at x=0 mm where the left slot 504 is. As can be seen, the magnetic field above/below the end of a slot 504 is amplified. Therefore, these places are suited for placement of a Hall sensor for measurement of the value of the magnetic field. Also, looking at the direction of the current flow lines, the field is negative when a slot 504 is at the right and negative if a slot 504 is at the left.

Figure 26:
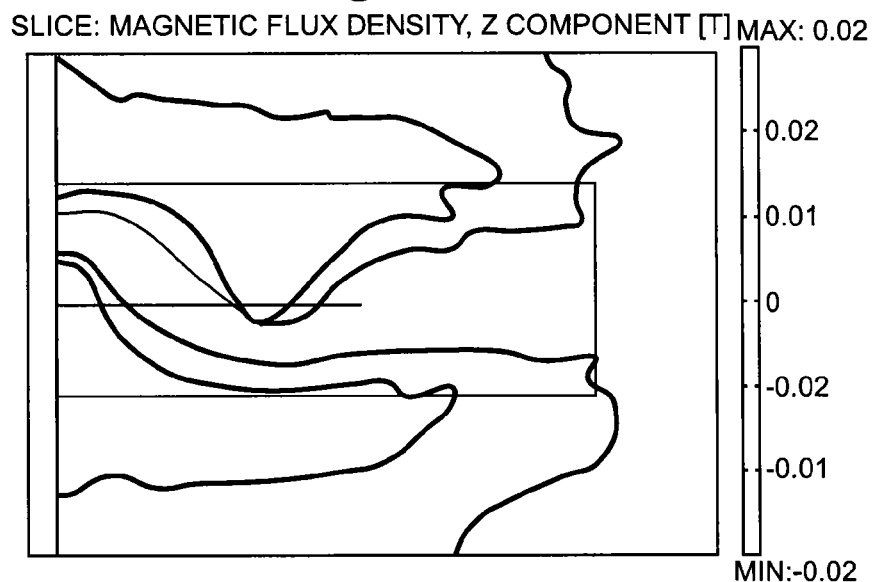
FIG. 26 depicts a magnetic field plot according to an embodiment.

If the $B_z$ field is sampled about 30 µm above the 2 mm-thick conductor 514 while about 202 A are flowing through conductor 514, FIG. 26 results in one embodiment. FIG. 26 illustrates that the field has a positive maximum above the end of a center slot and a negative minimum above the end of a right slot.

Figure 27:
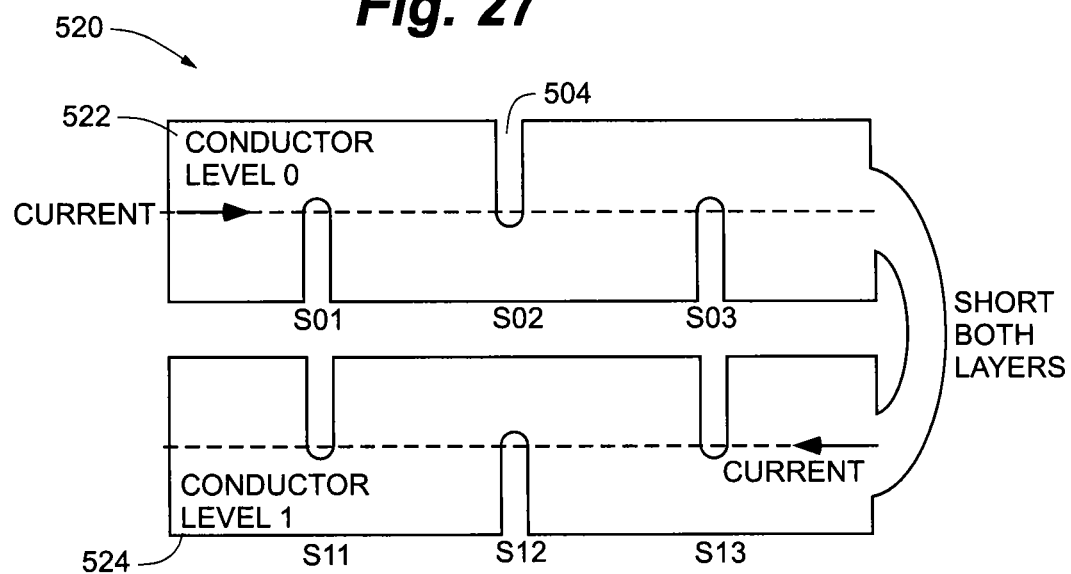
FIG. 27 depicts a conductor according to an embodiment.
Figure 28A:
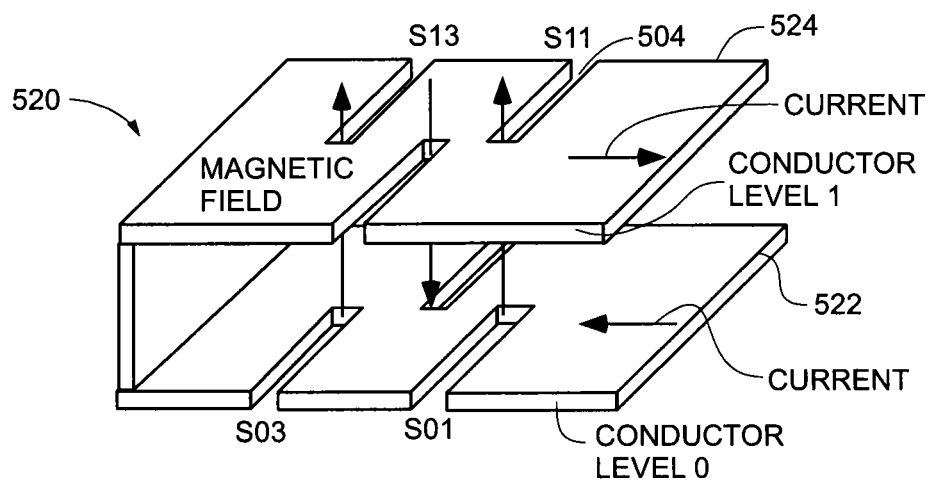
FIG. 28A depicts a conductor according to an embodiment.

In one embodiment, two or more conductors can be combined as depicted in FIG. 27 in order to increase the magnetic field strength, although generally at the cost of internal resistance. Conductor 520 comprises a first level 522 and a second level 524 above first level 522. FIG. 28 depicts a three-dimensional view of conductor levels 522 and 524.

Figure 29:
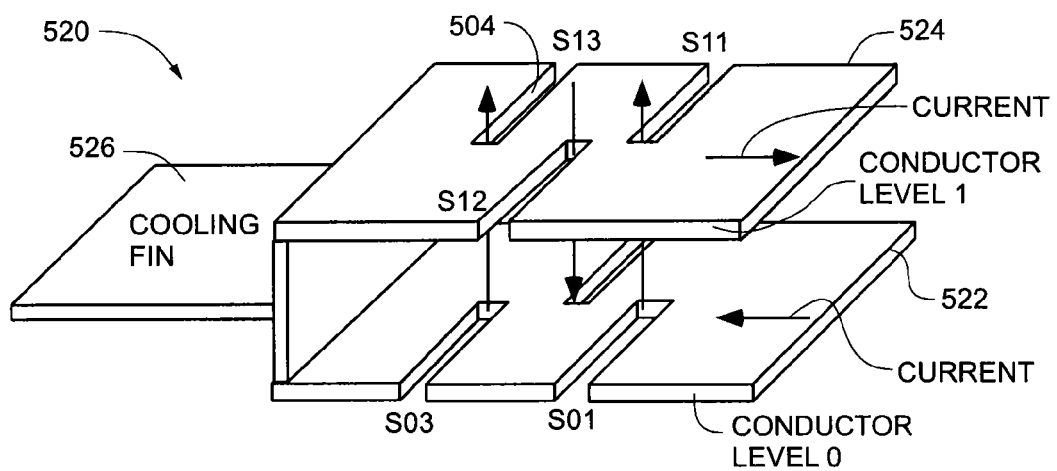
FIG. 29 depicts a conductor according to an embodiment.

In can be advantageous in embodiments, such as if the device is mounted in an upright position, to extend the primary conductor to form a cooling fin 526, shown in FIG. 29, which can help in delivering the wattage dissipated in the current sensor. Fin 526 can protrude from the molded part of the package to achieve a low thermal resistance (i.e. a large heat transfer coefficient). Further, conductors on level 0 (522) and 1 (524) in the direction of the slots 504 can also be formed to protrude from the mold body of the package and form additional cooling fins.

The semiconductor die may be placed in between both levels 524, 526 of conductors in one embodiment, although in other embodiments the die can also be placed above the upper conductor 524 or below the lower conductor 522. Additional conductor layers can also be formed in other embodiments, and the die can be placed between adjacent layers, above a top layer or below a bottom layer. For low current sensors, such as for about 1 A, it can be advantageous to integrate the layers, such that the layers form top metal layers of the semiconductor die, similar to power metal layers in power BiCMOS silicon technologies. For higher current ranges, such as about 5 A to about 10 A, these layers may be formed in or on a multi-layer printed circuit board. For even higher current ranges, such as about 10 A to about 100 A, these layers may be formed with a solid sheet layer of copper, which may also replace the die-pad of the ordinary leadframe. In embodiments, these technologies can be mixed by having one layer formed as a top metal layer in the silicon foundry while another layer is appended on at the printed circuit board level.

Figure 28B:
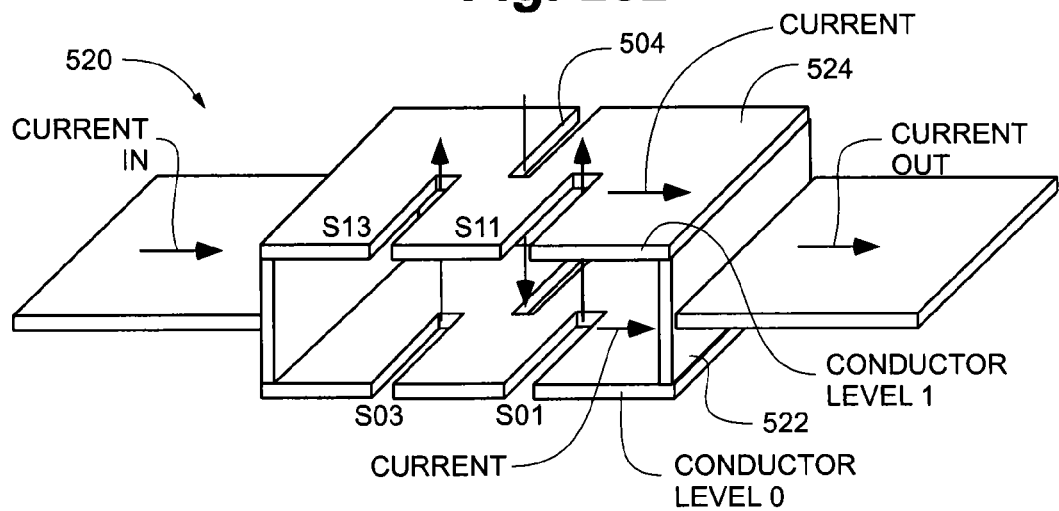
FIG. 28B depicts a conductor according to an embodiment.

In another embodiment depicted in FIG. 28B, the current is split, with a first current portion conducted through upper conductor 524 and a second current portion conducted through lower conductor 522. Different from as depicted in the embodiment of FIG. 29, the first and second current portions in FIG. 28B flow in the same direction in both conductors 522, 524. This configuration reduces the electrical resistance. In this parallel connection of conductors, the slots in conductors 522, 524 are congruent as opposed to mirror symmetric as in FIG. 29. In FIG. 28B, upper and lower conductors 522, 524 are formed of separate pieces. In addition to lower resistance, another advantage of this configuration is that if the die is placed in between both conductors, the magnetic field can be designed to be homogeneous along the vertical position.

Figure 30:
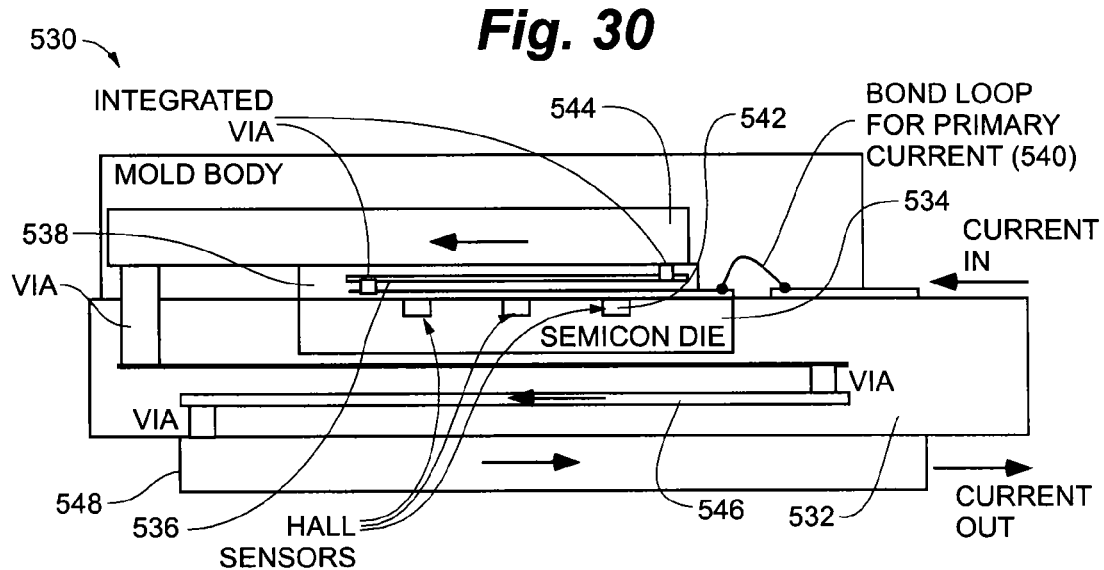
FIG. 30 depicts a sensor system according to an embodiment.

If a stack of several layers is formed, it can be advantageous to increase the thickness of each layer with distance to the magnetic field sensors, as depicted in FIG. 30. FIG. 30 does not show the bond wires for the sensor, such as for sensor ground, supply and inputs/outputs). System 530 comprises a multi-layer printed circuit board (PCB) 532 with a recess in which the semiconductor die 534 is placed. Die 534 comprises two top metal layers 536 structured as a slotted primary conductor, as described above, and embedded in an isolating layer 538. The current enters from the right on a PCB-trace via one or more bond loops 540 onto the lowest metal layer shown on die 534. After the current has passed Hall probes 542 at the left side of die 534, the current passes up to a thicker top metal layer integrated in the semiconductor fabrication process) and again passes Hall probes 542, although this time from left to right with respect to the orientation on the page. At the right side the current passes up yet another level to a conductor foil 544. The current flows from right to left and then down at the left side into PCB 532. PCB 532 comprises two internal layers 546. Below PCB is another layer 548, at the right of which the current leaves system 530.

In system 530, the thickness of the various layers generally increases with distance from Hall probes 542. In one embodiment, this can optimize the ratio of magnetic field on the sensors over power dissipation in the conductor. It can also be advantageous for the current to leave device 530 on the same side as it enters, thereby flowing through an even number of layers. This enables the magnetic field of structure 530 to vanish outside the sensor in order to not disturb any neighboring devices, such as if multiple current sensors are arranged adjacent each other.

Several layers may also be arranged electrically in parallel. In such embodiments, slots 504 can be arranged above each other.

Multiple three-dimensionally thick conductors placed above each other analogous to the flat conductors described herein above can also be used. Such an arrangement can be advantageous if the die is placed between conductors 544 and 548.

In view of the field plots described above, placement of the Hall sensors can be determined. In one embodiment, a Hall sensor can be disposed directly above or below the end of each slot. It is thus irrelevant if the Hall plate is smaller or larger than the slot, and the slot could in principle be infinitely narrow while the Hall plate is typically about 50 to about 100 μm wide. In an embodiment, the size of the slot scales with a vertical distance of the Hall sensor to the surface of the conductor. For example, if the Hall sensor is 300 μm off the surface of the conductor, it would not follow to for a slot with a 30 μm diameter, because this configuration would result in a very sharp peak of current density, and thus magnetic field, which would not protrude far enough into space to reach the Hall element.

Figure 31:
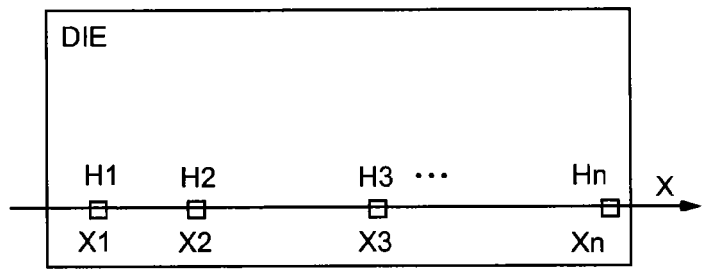
FIG. 31 depicts a sensor system according to an embodiment.

Suppression of inhomogeneous magnetic background fields with a general higher-order gradiometer according to embodiments will be described with reference to FIG. 31. In FIG. 31, a die with n magnetic field sensor elements, H1-Hn, distributed along a straight line parallel to the x-direction is depicted. The background field can be expressed as a Taylor series:

$$B(x) = B(x_1) + (x - x_1)\frac{\partial B(x_1)}{\partial x} + \frac{(x - x_1)^2}{2}\frac{\partial^2 B(x_1)}{\partial x^2} +$$
$$\frac{(x - x_1)^3}{3!}\frac{\partial^3 B(x_1)}{\partial x^3} + \ldots + \frac{(x - x_1)^n}{n!}\frac{\partial^n B(x_1)}{\partial x^n} + O((x - x_1)^{n+1})$$

The signal of the m-th magnetic field sensor becomes $$H_m = B(x_n)$$
$$\cong B(x_1) + (x_m - x_1)\frac{\partial B(x_1)}{\partial x} + \frac{(x_m - x_1)^2}{2}\frac{\partial^2 B(x_1)}{\partial x^2} +$$

-continued
$$\frac{(x_m - x_1)^3}{3!}\frac{\partial^3 B(x_1)}{\partial x^3} + \ldots + \frac{(x_m - x_1)^n}{n!}\frac{\partial^n B(x_1)}{\partial x^n}$$

if the error of order n+1 is neglected. The current sensor computes the signal $$S_{total} = H_1 + k_2 H_2 + k_3 H_3 + \ldots + k_n H_n \text{ with } k_1 = 1.$$

In the above equation, the coefficients $k_2 \ldots k_n$ are real numbers that depend on the x-location of the magnetic field sensors via the following set of n+1 simultaneous equations, where p runs from 0 to n, and $\delta_{m,p}$ is Kronecker's Delta:

$$S_{total} = 0 \text{ if } \frac{\partial^m B(x_1)}{\partial x^m} = \delta_{m,p} \text{ simultaneously for all } m = 0 \ldots n$$

For the case in which n=3, the solution is as follows:

$$k_1 = 1, k_2 = -(x_0 - x_2)/(x_1 - x_2), k_3 = (x_0 - x_1)/(x_1 - x_2).$$

If the three sensor elements are equidistantly spaced on a regular grid, it follows that $x_2 - x_1 = x_1 - x_0$ and $k_2 = -2, k_3 = 1$, or $S_{total} = H_1 - 2H_2 + H_3$.

For the case in which n=4, the solution is:

$$k_1 = 1, k_2 = -\frac{(x_0 - x_2)(x_0 - x_3)}{(x_1 - x_2)(x_1 - x_3)}, k_3 = \frac{(x_0 - x_1)(x_0 - x_3)}{(x_1 - x_2)(x_2 - x_3)},$$
$$k_4 = -\frac{(x_0 - x_1)(x_0 - x_2)}{(x_1 - x_3)(x_2 - x_3)}.$$

If the four sensor elements are equidistantly spaced on a regular grid, then $x_3 - x_2 = x_2 - x_1 = x_1 - x_0$ and $k_2 = -3, k_3 = 3, k_4 = -1$.

For the case in which n=5, the solution is:

$$k_1 = 1, k_2 = \frac{(x_0 - x_2)(x_0 - x_3)(x_0 - x_4)}{(x_2 - x_1)(x_3 - x_1)(x_4 - x_1)},$$
$$k_3 = \frac{(x_0 - x_1)(x_0 - x_3)(x_0 - x_4)}{(x_1 - x_2)(x_2 - x_3)(x_2 - x_4)},$$
$$k_4 = \frac{(x_0 - x_1)(x_0 - x_2)(x_0 - x_4)}{(x_1 - x_3)(x_2 - x_3)(x_4 - x_3)},$$
$$k_5 = \frac{(x_0 - x_1)(x_0 - x_2)(x_0 - x_3)}{(x_1 - x_4)(x_2 - x_4)(x_3 - x_4)}.$$

If the five sensor elements are equidistantly spaced on a regular grid, then $x_4 - x_3 = x_3 - x_2 = x_2 - x_1 = x_1 - x_0$ and we get: $k_2 = -4, k_3 = 6, k_4 = -4, k_5 = 1$.

In generally, crosstalk is reduced with an increasing number of slots and Hall probes and with decreasing distance between them. The limit to the total number of corresponding slots is given by the maximum allowed internal resistance of the primary conductor, the manufacturability of slots (narrow slots become increasingly difficult to manufacture), and by the maximum die size (which increases costs of the semiconductor). In practice, the crosstalk suppression in embodiments of three Hall probes is quite good and is generally high enough for most applications.

Figure 32:
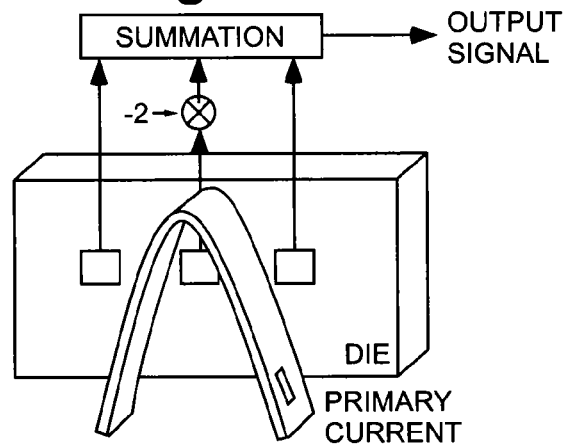
FIG. 32 depicts a sensor system according to an embodiment.
Figure 33:
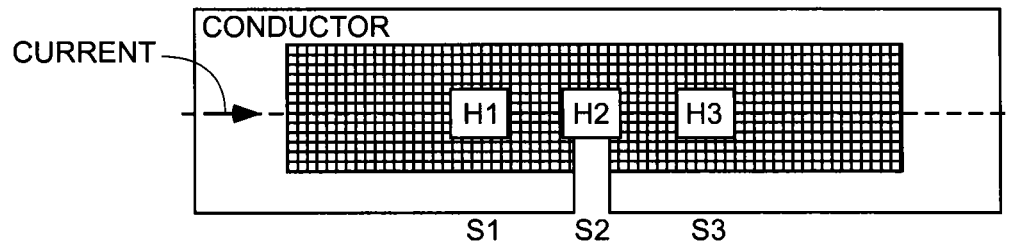
FIG. 33 depicts a sensor system according to an embodiment.

Sensor systems having three Hall probes can also have slightly different shapes in various embodiments, although some may not be optimum in terms of resistance, thermal conductivity and stiffness. In the embodiment of FIG. 32, which comprises three Hall sensors and differential measurement, the output is equal to the sum of the outer Hall signals minus two times the center Hall signal. The conductor can also comprise only a single slot, as depicted in FIG. 33, to bend the current lines in the shape of a "U" around the slot.

Figure 34A:
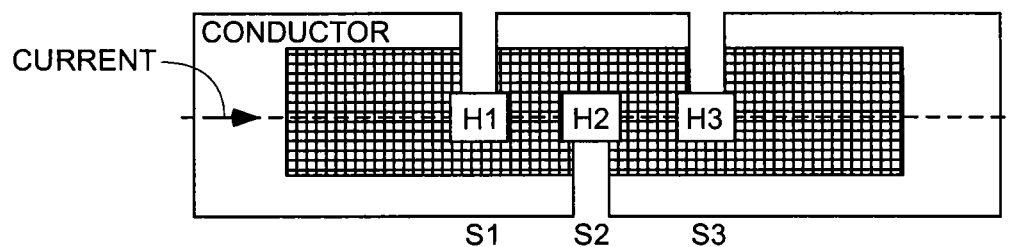
FIG. 34A depicts a sensor system according to an embodiment.
Figure 34C:
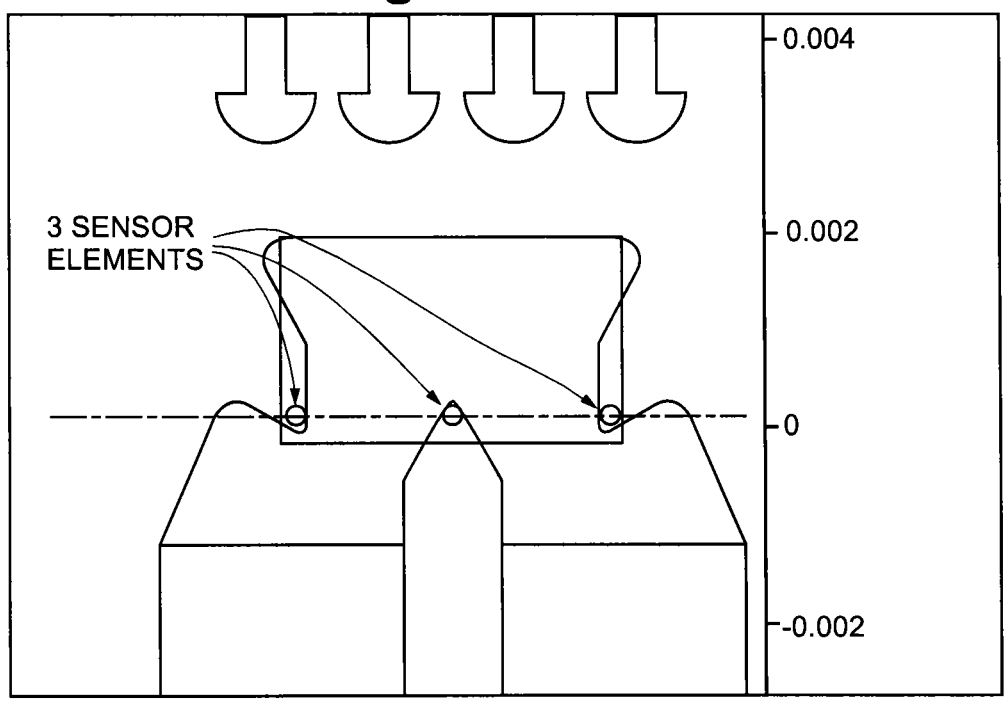
FIG. 34C depicts a sensor system according to an embodiment.

A more advantageous configuration can comprise three slots, as depicted in FIG. 34A, because such a configuration can provide a higher magnetic field at only slightly increased resistance of the conductor. FIG. 34B depicts an embodiment comprising a U-shaped conductor 550. In the embodiment of FIG. 34B, a slot is not necessary to bend current lines as in other embodiments described herein. Rather, corners 552 of conductor 550 can be used for a similar or the same effect. In an embodiment, corners 552 are about 90 degrees, while in other embodiments corners 552 are in a range of about 0 degrees to about 120 degrees. A slot 554 can also be considered to comprise a corner of about 0 degrees to about 30 degrees in an embodiment. Another embodiment is depicted in FIG. 34C.

Figure 35:
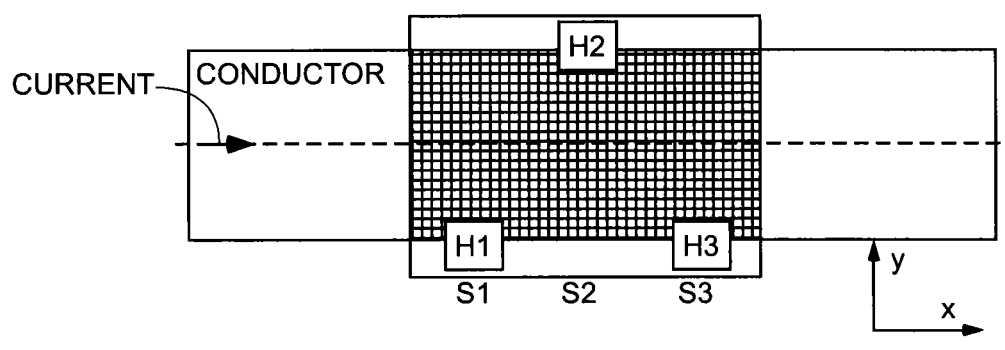
FIG. 35 depicts a sensor system according to an embodiment.

An alternative configuration is depicted in FIG. 35, in which the current is straight without bending, providing the advantage of lower resistance but a disadvantage of suppressing only external field gradients in the x-direction but not in the y-direction. Such a configuration can be appropriate in embodiments in which a width of the conductor in the y-direction is small compared to the x-direction distance between the sensor elements. For example, and referring again to FIG. 34A, the internal resistance of the conductor can be reduced by shifting the middle sensor element, as well as the corresponding slot, slightly downward in the y-direction, such as by up to several tenths of a millimeter. This will also, however, cause a slightly reduced suppression of inhomogeneous background fields, but as long as it is similar to the effect of a mismatch of the sensor elements, the reduced suppression will not degrade the performance of the system significantly.

In an embodiment of a conductor having a geometry similar to that of FIG. 34B, a center slot reaches to y=0.05 mm, which is slightly above the x-axis, whereas the outer corners reach down to y=−0.05 mm, which is slightly below the x-axis, and both the tip of the slot and the corners have radii of curvature with their centers located exactly on the x-axis (y=0). The reason becomes apparent in view of the field distribution: there the extreme values of magnetic field are shifted into the slot/corner region, and the center peak is located at y=−0.3 mm, whereas the peak near the corner is at y=+0.3 mm.

Thus, even though the centers of radii of all slots and corners are on a straight line, the x-axis, the peaks in the field distribution are not. It is therefore advantageous in an embodiment to shift the magnetic field sensors accordingly so that the sensors experience the maximum field. Keeping the sensor elements exactly at y=0 results in a loss of about 17% of the signal as compared to the peaks of the field. The problem is that if the sensor elements are not on a straight line, they only suppress background fields which are constant with respect to the y-coordinate, yet they do not suppress fields with are inhomogeneous along the y-direction. Yet, as long as the shift is small, such as about +/−0.3 mm in an embodiment, this is still a good compromise, particularly as perfect suppression of background fields works only for perfect matching of magnetic sensor elements, which limits background suppression anyhow. In another embodiment, the tip of the center slot can be shifted to even larger y-positions. The peaks of the field distribution are then closer to a horizontal axis and all three sensor elements could be placed on this straight line, yet this increases the internal resistance of the conductor, which is a drawback.

As previously mentioned, the Hall probes can be arranged along a straight line such that, moving along the strongest current line, Hall probes are arranged on the left and right alternately. The strongest current line is generally where the magnitude of current density is highest on a surface of constant potential.

Figure 36:
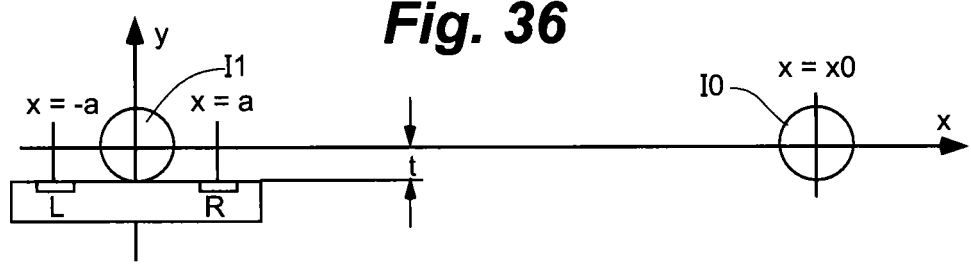
FIG. 36 depicts a sensor system according to an embodiment.

An advantage of embodiments comprising three or more Hall sensors is increased immunity to background fields from neighboring conductors as shown in FIG. 36, which is a cross-section of a die with two conductors having circular cross-sections, and as follows:

$$\vec{B}_L = \frac{\mu_0 I_1}{2\pi(a^2+t^2)}\binom{t}{-a} + \frac{\mu_0 I_0}{2\pi((a+x_0)^2+t^2)}\binom{t}{-a-x_0}$$

$$\vec{B}_R = \frac{\mu_0 I_1}{2\pi(a^2+t^2)}\binom{t}{a} + \frac{\mu_0 I_0}{2\pi((a-x_0)^2+t^2)}\binom{t}{a-x_0}$$

$I_1$ is the current to be measured, while $I_0$ is a neighboring current, which generates a background field. Crosstalk suppression can be expressed as follows:

$$CS = \frac{\vec{n}_y(\vec{B}_R - \vec{B}_L)(I_0 = 0)}{\vec{n}_y(\vec{B}_R - \vec{B}_L)(I_1 = 0)}$$

$$= \frac{\frac{2}{1+(t/a)^2}}{\frac{1+x_0/a}{(1+x_0/a)^2+(t/a)^2} + \frac{1-x_0/a}{(1-x_0/a)^2+(t/a)^2}}$$

Figure 37:
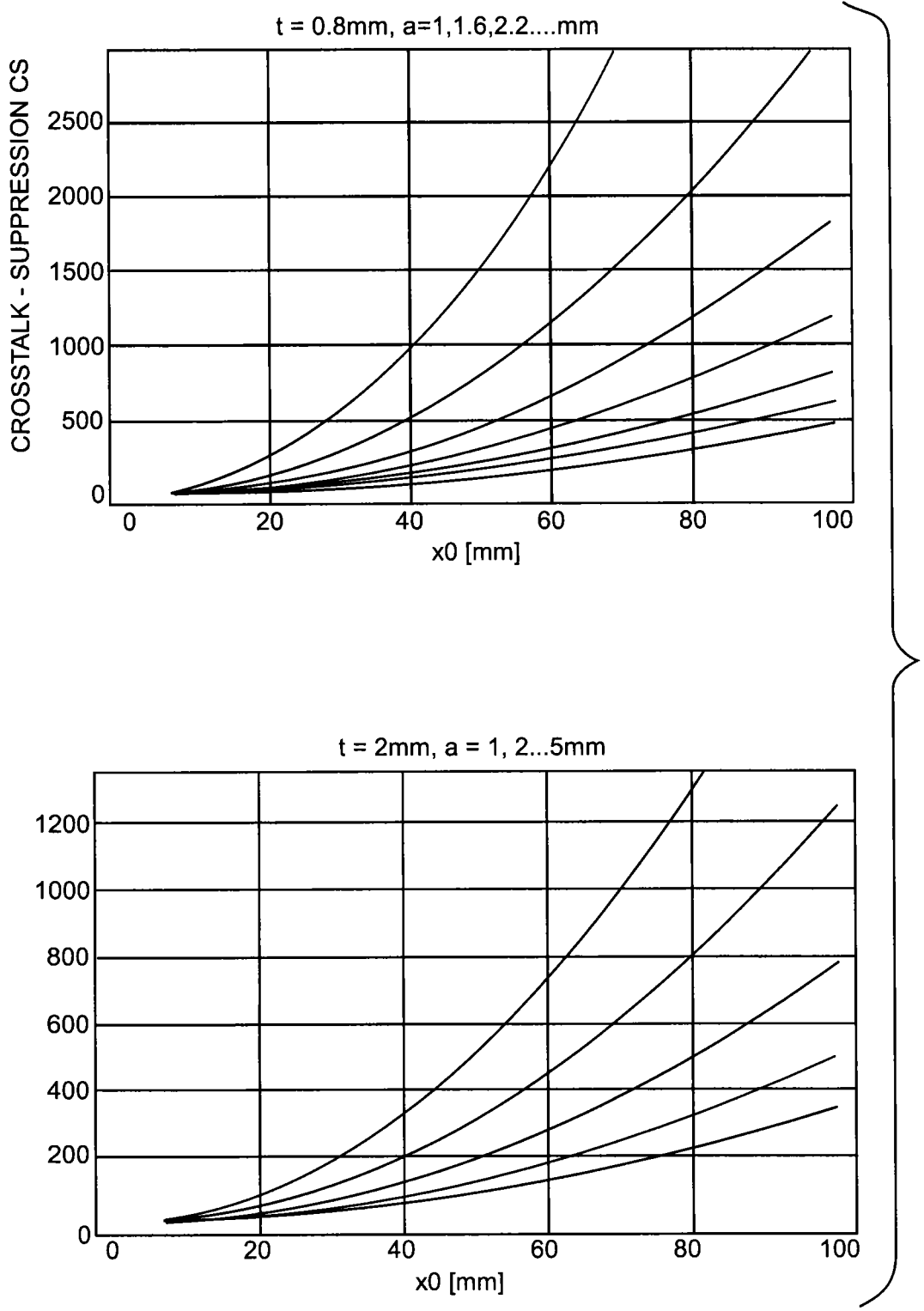
FIG. 37 depicts crosstalk suppression charts according to embodiments.

CS is generally not very high. If the power line $I_0$ is at a typical distance of $x_0$=50 mm and t=0.8 mm, the suppression is between about 100 (if the Hall probe distance is large, such as 2a=10 mm) and 1600 (if the Hall probes are closer, such as 2a=2 mm). If the isolation gap increases, the suppression is about 700 (2a=3.2 mm, x0=50 mm and t=2 mm). Refer also to FIG. 37.

Figure 38:
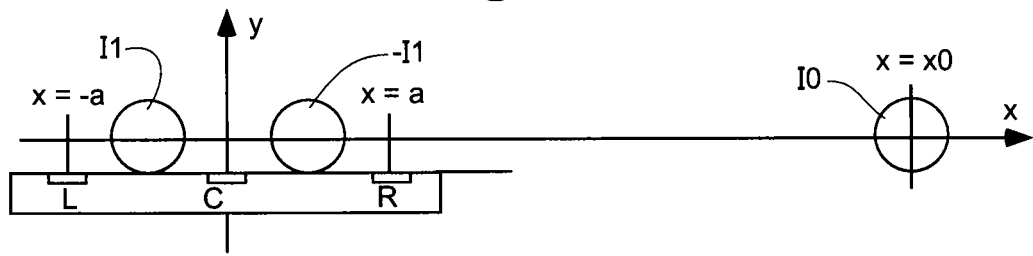
FIG. 38 depicts a sensor system according to an embodiment.

A three Hall element differential system is depicted in FIG. 38. The magnetic fields can be expressed as follows:

$$\vec{B}_L = \frac{-\mu_0 I_1}{2\pi((-a-b)^2+t^2)}\binom{t}{-a-b} +$$
$$\frac{\mu_0 I_1}{2\pi((-a+b)^2+t^2)}\binom{t}{-a+b} + \frac{\mu_0 I_0}{2\pi((-a-x_0)^2+t^2)}\binom{t}{-a-x_0}$$

$$\vec{B}_C = \frac{-\mu_0 I_1}{2\pi((0-b)^2+t^2)}\binom{t}{0-b} + \frac{\mu_0 I_1}{2\pi((0+b)^2+t^2)}\binom{t}{0+b} +$$
$$\frac{\mu_0 I_0}{2\pi((0-x_0)^2+t^2)}\binom{t}{0-x_0}$$

$$\vec{B}_R = \frac{-\mu_0 I_1}{2\pi((a-b)^2+t^2)}\binom{t}{a-b} + \frac{\mu_0 I_1}{2\pi((a+b)^2+t^2)}\binom{t}{a+b} +$$
$$\frac{\mu_0 I_0}{2\pi((a-x_0)^2+t^2)}\binom{t}{a-x_0}$$

The crosstalk-suppression can be expressed as follows:

$$CS = \frac{\vec{n}_y(2\vec{B}_C - \vec{B}_R - \vec{B}_L)(I_0 = 0)}{\vec{n}_y(2\vec{B}_C - \vec{B}_R - \vec{B}_L)(I_1 = 0)}$$

-continued $$= 2 \frac{\frac{2b}{b^2+t^2} + \frac{a-b}{(a-b)^2+t^2} - \frac{a+b}{(a+b)^2t^2}}{\frac{1+x_0/a}{(1+x_0/a)^2+(t/a)^2} + \frac{-1+x_0/a}{(1-x_0/a)^2+(t/a)^2} - \frac{2x_0/a}{(x_0/a)^2(t/a)^2}}$$

Even at 2a=5 mm, 2b=2 mm, and $x_0$=50 mm and t=0.8 mm, the crosstalk suppression is about 30,000, or 90 dB, which is about 40 times better than for a simple two Hall element system.

Higher crosstalk suppression can theoretically be achieved with 4-, 5-, or 6-Hall element systems. A limitation to crosstalk suppression, however, is mismatch of magnetic sensitivities of all Hall probes. If two Hall probes have slightly different magnetic sensitivities, the difference is not completely independent of homogeneous background fields. Therefore, such systems need means to adjust the magnetic sensitivity of all Hall probes and keep it at a highly matched level. To this end, embodiments of the system are equipped with several test modes in which differences in signals between two neighboring Hall probes are output. During backend testing, homogeneous magnetic fields are applied to the sensor, so it is possible to detect the mismatch in magnetic sensitivity between each two neighboring Hall-sensors. Moreover, the system can comprise memory, such as EEPROM, in which adjustment coefficients for the magnetic sensitivity and temperature dependence can be stored. During operation, the system can use these coefficients to adjust the magnetic sensitivities of all Hall probes until they are equal. This can provide a high degree of background suppression. Because magnetic sensitivity is influenced by mechanical stress, a stress compensation circuit can also be used, such as is disclosed in commonly owned German Patent Application No. DE102006045141.4, which is incorporated herein by reference in its entirety.

The performance of embodiments of the sensor system can also improved if integrated on a single die having highly homogeneous temperature, mechanical stress, and semiconductor process parameters. An electrostatic shield layer may also be inserted between the magnetic field sensors and the primary conductor. Sufficiently thick high quality dielectric isolation layers can also be inserted between the various metal layers of the primary conductor and the sensor die in order to separate the voltage potential of the primary circuit, typically high current and high power, from the low voltage sensor circuit. Embodiments of the sensor system can also utilize an advanced spinning current technique to reduce the offset of the Hall probes, which is the output signal in the absence of any magnetic field acting on it, such as down to about 10 µT effective in one embodiment.

Planar Hall probes can be arranged above or below the end of each slot in one embodiment. The conductor may also be extended such that it comprises several layers isolated from each other and connected in series or parallel.

Figure 39:
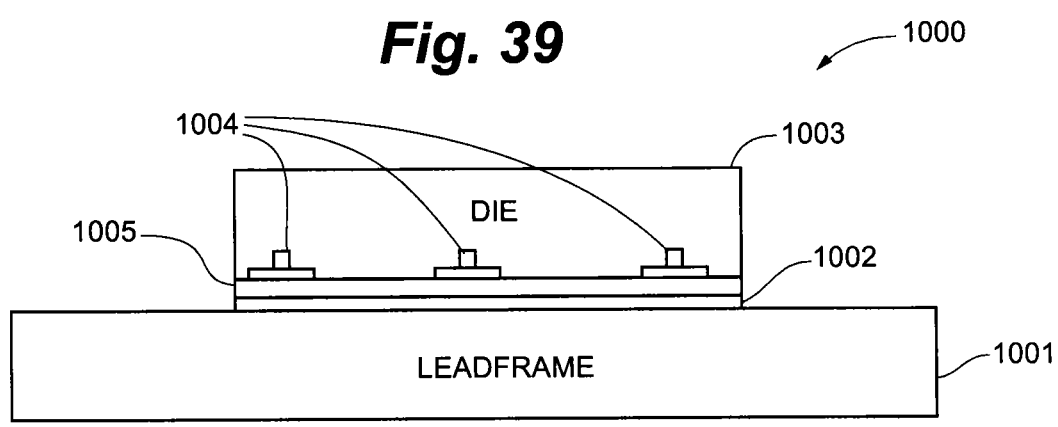
FIG. 39 depicts a magnetic sensor arrangement according to an embodiment.

FIG. 39 depicts a side perspective view of a die-based magnetic sensor arrangement that includes both a lead frame 1001 and a power metal portion 1002 according to an embodiment. According to the orientation depicted in FIG. 39, die 1003, including magnetic sensor elements 1004, is arranged atop leadframe 1001. Power metal portion 1002 is disposed between leadframe 1001 and die 1003, and is separated from die 1003 by electrical insulator layer 1005. In various embodiments, power metal portion 1002 may be formed of a different material than leadframe 1001. In other embodiments, power metal portion 1002 is formed of the same material as leadframe 1001.

Power metal portion 1002 may be formed on leadframe 1001 by various methods, for example sputtering, chemical vapor deposition, or other known ways for forming metallic structures on a small scale. In other embodiments, one or more thin metal layers may be applied to a surface of die 1003 after the wafer has undergone the ordinary front-end process with final PCM (process control monitoring), for example after insulator layer 1005 has been applied to die 1003. In one embodiment, power metal portion 1002 is formed to be 10 to 100 µm thick. In an embodiment, to reduce fabrication costs, power metal portion 1002 may be formed using ink jet systems as are known in the art, for example utilizing finely milled powders with sub-micron diameters, also known as nano-pastries.

In various embodiments, power metal portion 1002 and leadframe 1001 are constructed to modify properties of current flow with respect to magnetic sense elements 1004 to improve an ability of magnetic sense elements 1004 to detect a current. For example, power metal portion 1002 can be formed with finer slots than those of leadframe 1001 and/or with slots having smaller radii of curvature of the tip than those of leadframe 100, such as is depicted in FIGS. 40 and 41 described below.

Figure 40:
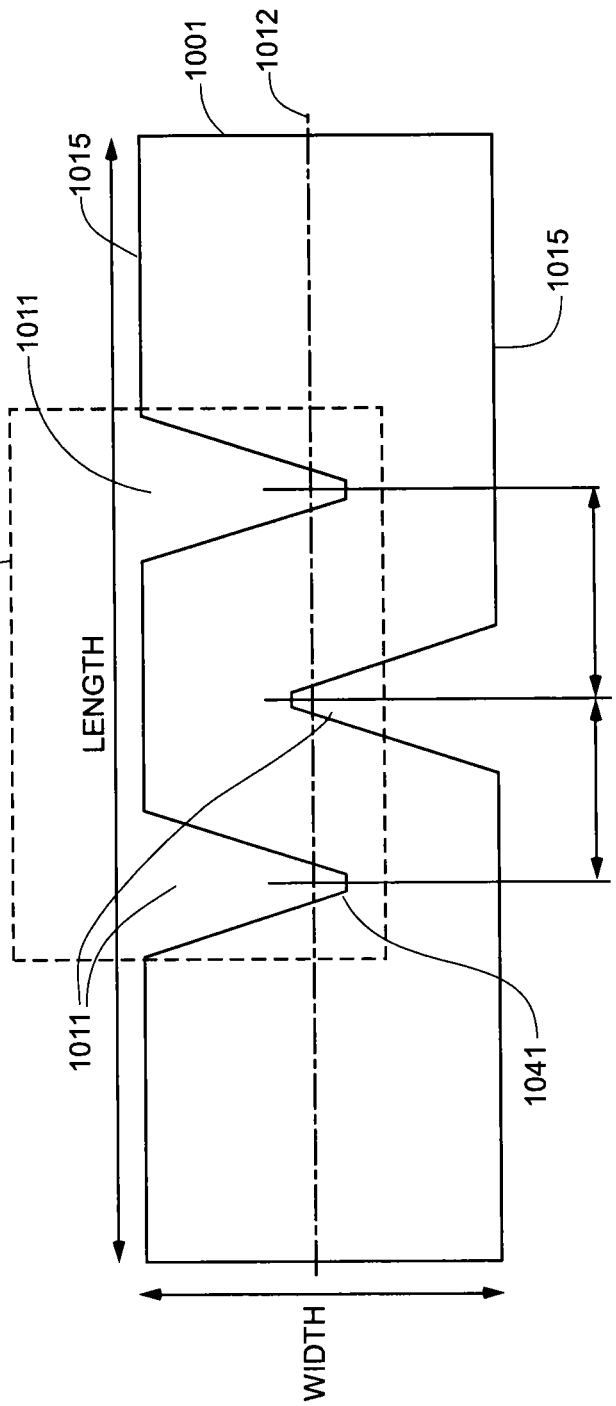
FIG. 40 depicts a leadframe according to an embodiment

FIG. 40 depicts a top-down view of a leadframe 1001 according to one embodiment. FIG. 40 also depicts a silhouette showing a positioning of an IC die 1003 according to one embodiment of a die 1003/leadframe 1001 arrangement. Leadframe 1001 is constructed to be generally flat (in a dimension parallel to the page of FIG. 40), with current flowing globally in a longitudinal direction relative to the configuration of the leadframe 1001. Leadframe 1001 may include at least one notch 1011. The at least one notch 1011 may be shaped and arranged to cause a path of a current moving through leadframe 1001 to change direction and travel around notch 1011, thus increasing a density of current for improved detection by magnetic sense elements 1004.

Notches 1011 may be formed perpendicular to the global current direction and extend from an edge 1015 of leadframe 1001. Notches may extend to points near an axis 1012 of leadframe 1001. In an embodiment, axis 1012 is arranged in a direction parallel to a global current direction of leadframe 1011. In an embodiment, at least one magnetic sense element 1004 may be arranged proximal to axis 1012. Notches 1011 may be arranged to interface with one or more magnetic sensor elements 1004 disposed at positions along axis 1012.

As also shown in the embodiment of FIG. 40, notches 1011 may be formed of a substantially triangular shape, with first and second sides 1041 arranged to form an angle with edge 1015. Other shapes of notches 1011 are also contemplated, for example any combination of rectangular, square, or partially or wholly arcuate notches 1011.

FIG. 41 depicts a top-down view of a power metal portion 1002 according to one embodiment as described above with respect to FIG. 39. As shown in FIG. 39, power metal portion 1002 may be constructed to interface with leadframe 1001 to improve current characteristics for sensing by magnetic sense elements 1004. In an embodiment, power metal portion 1002 may be in electrical contact with leadframe 1001.

Power metal portion 1002 may include at least one slot 1021 formed perpendicular to the global current direction and extending from edge 1025 of power metal portion 1002. In one embodiment, the at least one slot 1021 may extend to a position at or near an axis 1022 of power metal portion 1002. Axis 1022 is arranged in a direction parallel to a length of power metal portion 1002. In an embodiment, axis 1022 of power metal portion 1002 may be arranged to be aligned with axis 1012 of leadframe 1001. Leadframe 1001 notches 1011 and power metal portion 1002 slots 1021 may be constructed to be mutually aligned at positions along axis 1012, 1022 to improve current characteristics in proximity to magnetic sensor elements 1004.

As also depicted in the embodiment of FIG. 41, the at least one slot 1021 may include first and second sides 1026 arranged substantially perpendicular to edge 1025 of power metal portion 1002. In the depicted embodiment, end 1027 of slot 1021 may be radial or rounded to reduce a level of current density of power metal near end 1027. In other embodiments, end 1027 may be formed of different shapes, such as rectangular or triangular, based on a desired current density or other desired characteristics.

Figure 42A:
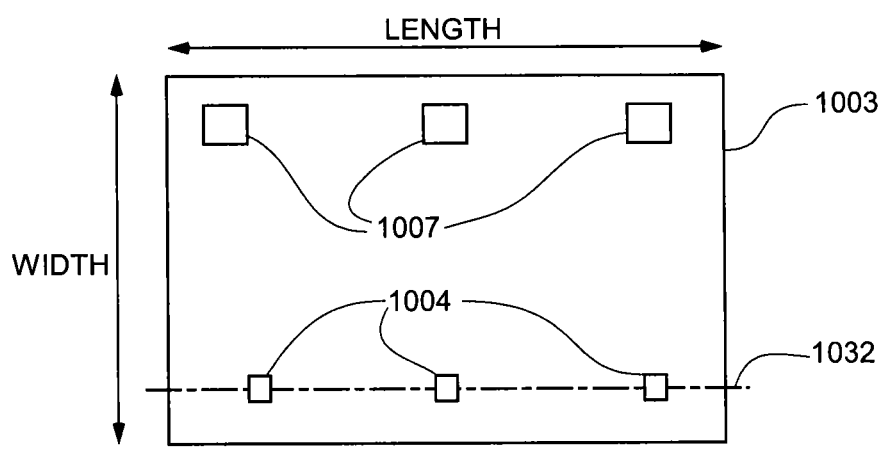
FIGS. 42A and 42B depict a die according to an embodiment.
Figure 42B:
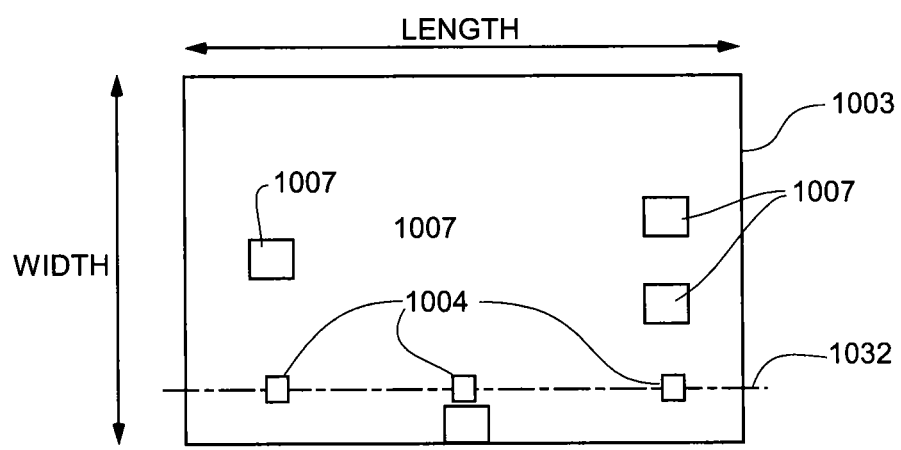

As shown in FIGS. 42A and 42B, die 1003 may also have an axis 1032. In an embodiment, when components 1001-1003 are arranged as depicted in the side-view embodiment of FIG. 39, axes 1012, 1022, and 1032 may be substantially aligned. According to these embodiments, magnetic sense elements 1004 may be substantially aligned with notches 1011 and slots 1021, thus enabling notches 1011 and slots 1021 to modify characteristics of a current path proximal to magnetic sense elements 1004, and thus improve an ability of magnetic sense elements 1004 to detect a magnetic field caused by current.

FIG. 42A depicts an IC die 1003 that includes at least one magnetic sense element 1004 according to one embodiment. In addition to magnetic sense elements 1004, die 1003 further includes a plurality of I/O pads 1007 that enable electrical connection to circuitry and other components of die 1003. According to the embodiment of FIG. 42A, pads 1007 are positioned such that when leadframe 1001 and power metal portion 1002 are with axes 1012, 1022 are substantially aligned with axis 1032 of die 1003, pads 1007 are exposed at a surface of die 1003, enabling electrical connections from above, such as by flip-chip, ball grid array pad/package arrangements, and others, or from the side, such as by bond loop and others.

In another embodiment depicted in FIG. 42B, pads 1007 may be formed at or near a surface of die 1007 disposed at positions closer to axis 1032 compared to pads 1007 of FIG. 42A. According to this embodiment, portions of slots 1011 distal from axis 1012, 1022, 1032, may be utilized as a feed through to enable electrical connection to pads 1007 from above, for example according to flip chip, ball grid array, or similar package/pad arrangements.

FIGS. 39-42 depict various elements of a particular arrangement of a die 1003, power metal portion 1002, and leadframe 1001, in which leadframe 1001 is constructed to include notches 1011 adapted to interface with slots 1021 of power metal portion 1002. In an embodiment, notches 1011 are not contiguous with slots 1021. Instead, notches 1011 are formed of a broader shape than slots 1021 for purposes of modifying characteristics of a current flowing through sensor 1000 to enable improved measurement of the current by magnetic sensor elements 1004.

FIGS. 43-47 depict various in-strip test embodiments according to various embodiments of the invention depicted and described herein. Given that the primary conductor is generally much larger than the signal pins of the leadframe, the conductor should be held firmly in the strip during testing after packaging. This can be accomplished by small bridges in the leadframe which are removed after testing to release the sensor from the leadframe. Such bridges typically comprise the same material as the rest of the leadframe, and this material is a good conductor. This can become a problem, however, because shorts can form between the ends of the primary conductor and the rest of the leadframe. If a current is injected into the primary conductor during testing, the current is shunted via the rest of the leadframe, making the test inaccurate or useless. It is not possible to avoid this problem by releasing the primary conductor before the end of the test because the primary conductor is the main part of the leadframe and, if not supported, cannot be handled by an ordinary in-strip test handler.

Instead, and according to an embodiment, the bridges can be repositioned to avoid shorts. FIG. 43 depicts a coupling arrangement of a plurality of IC-based current sensors for purposes of performing tests according to one embodiment. The arrangement of FIG. 43 is shown after molding and deflashing but before final test. A complete strip can be formed by extending the basic arrangement of FIG. 43 horizontally and vertically to cover an entire strip. The arrangement includes four current sensors 2002, each of which includes a primary conductor 2004, semiconductor die 2006 and magnetic field sensors 2008 positioned above the notches of primary conductors 2004. The mold body is shown at 2010 and the sensor pins at 2012. A bridge 2014 connects primary conductor 2004 of one sensor 2002 with mold body 2010 of another sensor, as shown on the right, or two mold bodies of neighboring sensors 2002, as shown on the left. Bridges 2014 provide rigid mechanical links between devices 2002 in the strip while eliminating the problem of electrical shorts between pins 2012 and/or primary conductors 2004 of neighboring sensors 2002.

Figure 44:
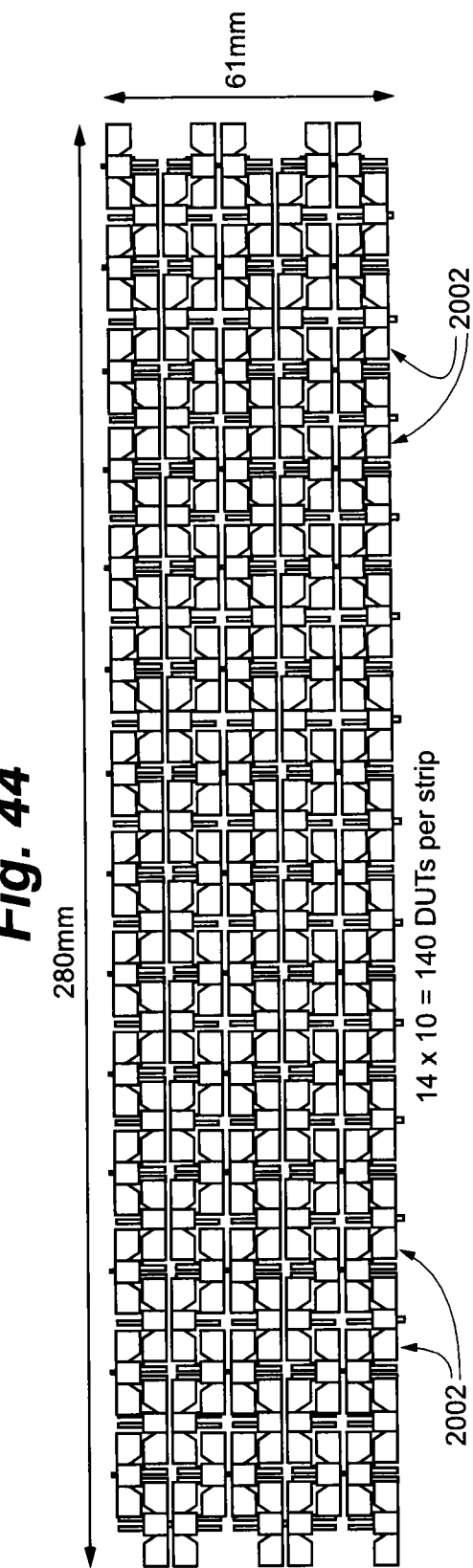
FIG. 44 depicts a strip of current sensors according to an embodiment.

FIG. 44 depicts a coupling arrangement of a plurality of IC-based current sensors 2002 for purposes of performing tests. The dimensions are exemplary of only one embodiment and may vary in other embodiments. In FIG. 44, strip 2016 is about 280 mm by about 61 mm and comprises 140 devices under test (DUT). After test, sensors 2002 which have passed are singulated by cutting off or otherwise severing bridges 2014 and taping bridges 2014.

Figure 45:
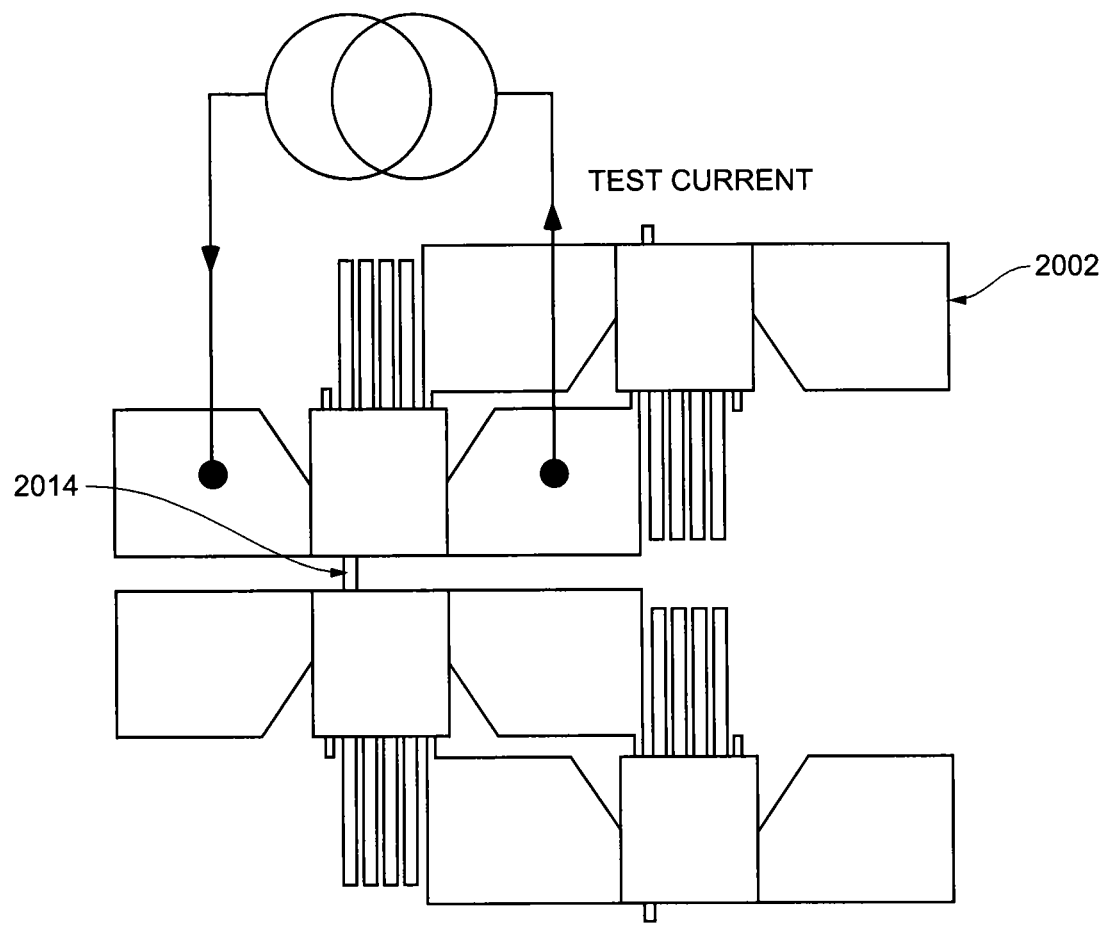
FIG. 45 depicts a coupling arrangement of a plurality of current sensors according to an embodiment.
Figure 46:
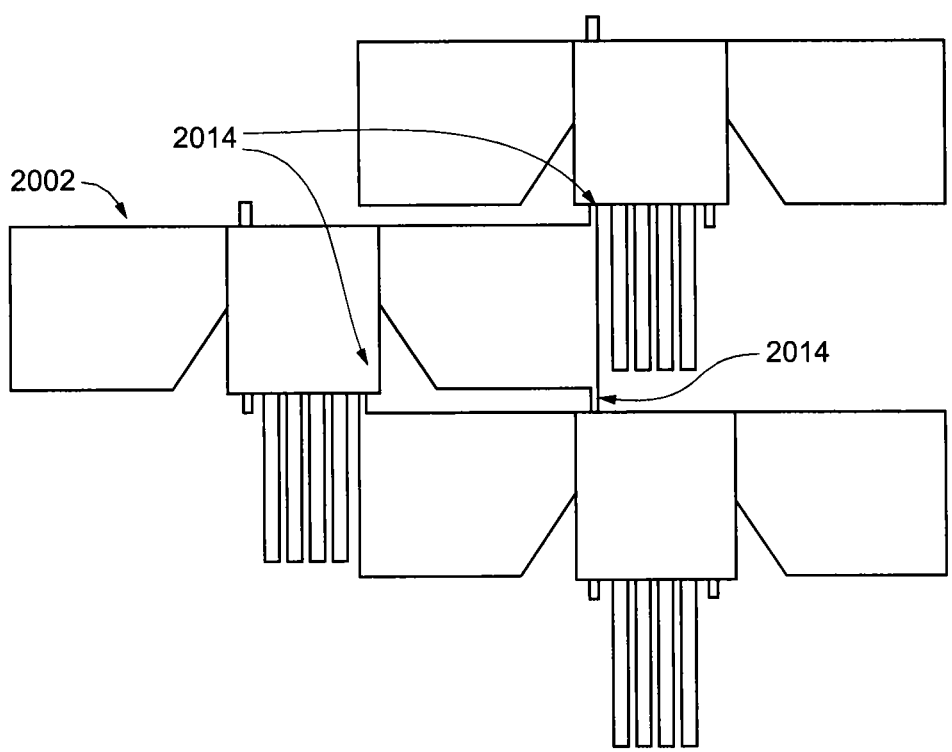
FIG. 46 depicts a coupling arrangement of a plurality of current sensors according to an embodiment.

In test, it is not necessary for the primary conductors 2004 to be completely electrically isolated from other sensors 2002 on the strip, because a single link does not short the current. Thus, neighboring primary conductors 2004 can be coupled in one embodiment as depicted in FIG. 45. FIG. 46 depicts another alternative coupling arrangement of a plurality of IC-based current sensors 2002 for purposes of performing tests according to one embodiment.

Figure 47:
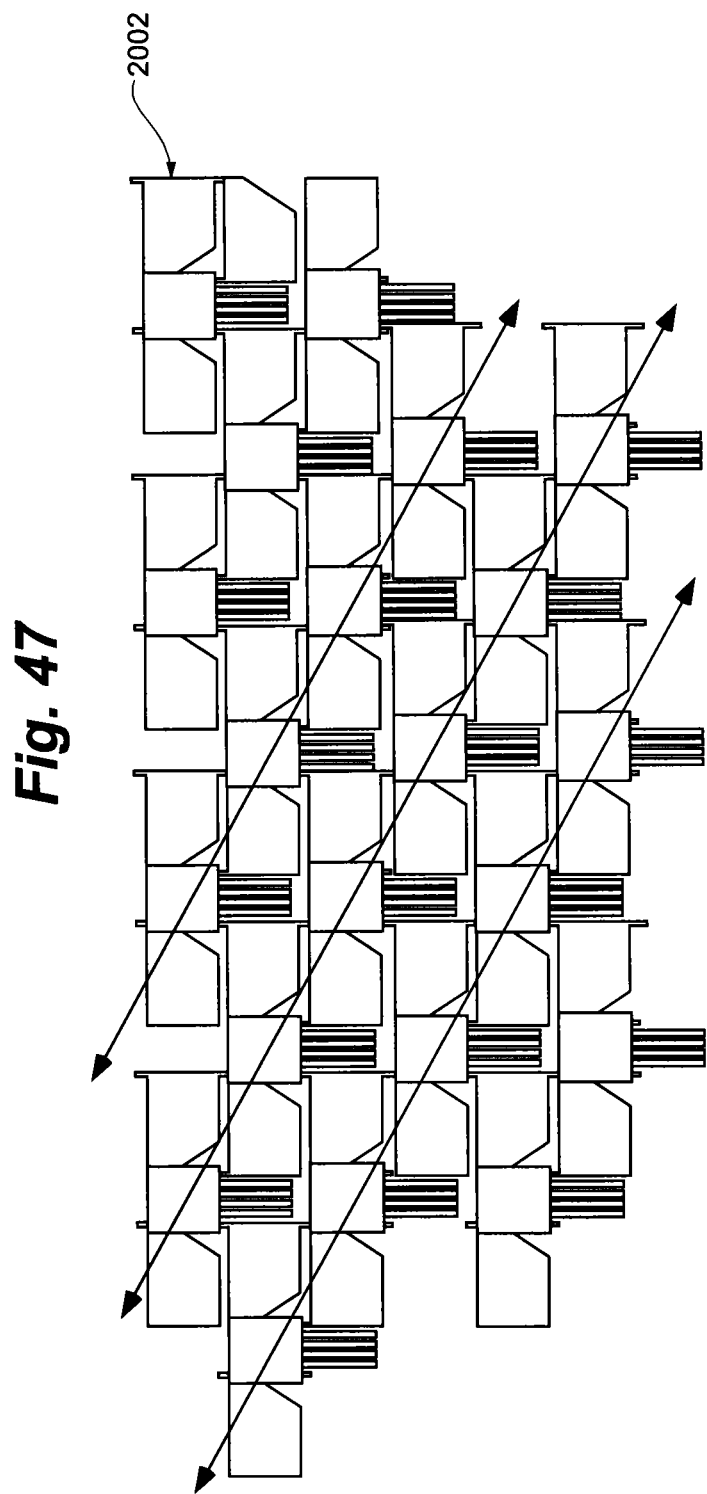
FIG. 47 depicts a coupling arrangement of a plurality of current sensors according to an embodiment.

As depicted in FIG. 47, if several cells as depicted and described above are coupled diagonally in electrical contact, it is possible to test all devices in a row or all devices in a column simultaneously without interference from neighboring devices. This reduces overall test time and reduces the cost associated with test.

Although specific embodiments have been illustrated and described herein for purposes of description of an example embodiment, it will be appreciated by those of ordinary skill in the art that a wide variety of alternate and/or equivalent implementations calculated to achieve the same purposes may be substituted for the specific embodiments shown and described without departing from the scope of the present invention. Those skilled in the art will readily appreciate that the invention may be implemented in a very wide variety of embodiments. This application is intended to cover any adaptations or variations of the various embodiments discussed herein.

The invention claimed is:

1. A magnetic current sensor integrated in an integrated circuit (IC) and housed in an IC package comprising:

an IC die formed to present at least three magnetic sense elements linearly arranged to form a higher order gradiometer;

a planar conductor, wherein at least one planar slot is formed in the planar conductor, wherein a first end of the at least one planar slot and at least one of the magnetic sense elements are aligned such that the at least one of the magnetic sense elements is configured to sense an increased magnetic field induced in the planar conductor proximate the first end of the at least one planar slot; and an electrically isolating layer arranged between the planar conductor and the IC die.

2. The sensor of claim 1, wherein the at least three magnetic sense elements comprise Hall effect elements.

3. The sensor of claim 1, wherein the at least three magnetic sense elements are spaced apart from one another such that a distance separating a first magnetic sense element from a second magnetic sense element is less than a distance separating the first magnetic sense element from a third magnetic sense element.

4. The sensor of claim 3, wherein a space between adjacent ones of the at least three magnetic sense elements is substantially equal.

5. The sensor of claim 1, wherein a distance between at least one of the magnetic sense elements and the first end of the at least one planar slot is less than about 200 μm.

6. The sensor of claim 1, wherein the IC die presents three magnetic sense elements and three slots are formed in the conductor, each one of the three magnetic sense elements aligned with a first end of a different one of these three slots.

7. The sensor of claim 6, further comprising signal conditioning circuitry coupled to the three magnetic sense elements.

8. The sensor of claim 7, wherein the signal conditional circuitry is configured to output a signal related to a sum of magnetic fields sensed by first and second ones of the three magnetic sense elements minus two times a magnetic field sensed by a third one of the three magnetic sense elements, the third magnetic sense element arranged between the first and second ones of the three magnetic sense elements.

9. The sensor of claim 6, wherein a third one of the three magnetic sense elements is arranged between first and second ones of the three magnetic sense elements, and wherein a total current in the conductor passes between the first and third magnetic sense elements and between the second and third magnetic sense elements.

10. The sensor of claim 1, wherein the IC die presents three magnetic sense elements, wherein a first one of the three magnetic sense elements is positioned relative to a first end of the at least one planar slot, and wherein second and third ones of the three magnetic sense elements are positioned relative to first and second corners of the conductor, respectively.

11. The sensor of claim 1, wherein the electrically isolating layer comprises a metal layer.

12. The sensor of claim 11, wherein a first side of the electrically isolating layer carries traces coupled to signal pins of the sensor, and a second side of the electrically isolating layer is coupled to the planar conductor.

13. The sensor of claim 1, wherein the electrically isolating layer comprises at least one selected from the group consisting of glass, ceramic, tape and a printed circuit board.

14. A method comprising:

providing a magnetic current sensor having three sensing elements linearly arranged with respect to one another and each aligned with an end of one of three slots formed in a conducting portion;

sensing, by the three sensing elements, an increased current density in at least a portion of the conductor caused by the three slots; and outputting a signal related to a sum of magnetic fields sensed by first and second ones of the three sensing elements minus two times a magnetic field sensed by a third one of the three sensing elements, the third sensing element arranged between the first and second sensing elements.

15. The method of claim 14, further comprising determining a difference in magnetic fields sensed by different ones of the three sensing elements.

16. The method of claim 15, further comprising providing a differential output related to the current densities proximate the three sensing elements.

17. A method comprising:

providing a magnetic current sensor comprising at least three sensing elements linearly arranged with respect to one another and with at least one sensing element aligned with an end of a planar slot formed in a planar conducting portion such that the three sensing elements are operable as a higher order gradiometer;

sensing, by the at least three sensing elements, a magnetic field related to an increased current density in at least a portion of the planar conductor caused by the planar slot; and deriving a signal that is a linear combination of magnetic fields sensed by the at least three sensing elements to reduce an effect of at least one disturbance magnetic field.

18. The method of claim 17, wherein the at least one disturbance magnetic field comprises at least one of a homogenous background magnetic field or a magnetic field having a linear gradient.

* * * * *